(12) United States Patent
Baek et al.

(10) Patent No.: US 11,043,268 B2
(45) Date of Patent: Jun. 22, 2021

(54) RESISTIVE MEMORY DEVICES AND METHODS OF OPERATING RESISTIVE MEMORY DEVICES INCLUDING ADJUSTMENT OF CURRENT PATH RESISTANCE OF A SELECTED MEMORY CELL IN A RESISTIVE MEMORY DEVICE

(71) Applicant: Samsung Electronics Co., Ltd., Suwon-si (KR)

(72) Inventors: Jongmin Baek, Hwaseong-si (KR); Jinyoung Kim, Seoul (KR); Junho Shin, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/745,823

(22) Filed: Jan. 17, 2020

(65) Prior Publication Data

US 2021/0020236 A1    Jan. 21, 2021

(30) Foreign Application Priority Data

Jul. 16, 2019   (KR) ........................ 10-2019-0085541

(51) Int. Cl.
*G11C 13/00*   (2006.01)
*H01L 27/24*   (2006.01)

(52) U.S. Cl.
CPC ........ *G11C 13/003* (2013.01); *G11C 13/0004* (2013.01); *G11C 13/004* (2013.01); *G11C 13/0026* (2013.01); *G11C 13/0028* (2013.01); *G11C 13/0064* (2013.01); *G11C 13/0069* (2013.01); *H01L 27/2427* (2013.01); *H01L 27/2481* (2013.01); *G11C 2013/0078* (2013.01); *G11C 2213/72* (2013.01)

(58) Field of Classification Search
None
See application file for complete search history.

(56) References Cited

U.S. PATENT DOCUMENTS

| | | | |
|---|---|---|---|
| 6,480,438 B1 * | 11/2002 | Park | G11C 16/08 365/100 |
| 7,719,874 B2 * | 5/2010 | Scheuerlein | G11C 13/0023 365/148 |
| 8,295,092 B2 | 10/2012 | Kim et al. | |
| 8,730,731 B2 | 5/2014 | Kim et al. | |
| 9,685,227 B2 | 6/2017 | Lee et al. | |

(Continued)

*Primary Examiner* — J. H. Hur
(74) *Attorney, Agent, or Firm* — Harness, Dickey & Pierce, P.L.C.

(57) ABSTRACT

A resistive memory includes a memory cell array, a write/read circuitry and a control circuitry. The memory cell array includes a plurality of resistive memory cells coupled to a plurality of word-lines and a plurality of bit-lines. The write/read circuitry is coupled to the memory cell array through a row decoder and a column decoder, the write/read circuitry performs a write operation to write write data in a target page of the memory cell array, and verifies the write operation by comparing read data read from the target page with the write data. The control circuitry controls at least one of the row decoder, the column decoder and the write/read circuitry to control a resistance which a selected memory cell experiences according to a distance from an access point to the selected memory cell in the memory cell array based on an address.

20 Claims, 26 Drawing Sheets

(56) References Cited

U.S. PATENT DOCUMENTS

| | | | |
|---|---|---|---|
| 10,032,508 B1 | 7/2018 | Srinivasan et al. | |
| 2007/0034908 A1* | 2/2007 | Cho | G11C 13/0004 257/260 |
| 2009/0296459 A1* | 12/2009 | Kim | G11C 13/0004 365/163 |
| 2010/0014345 A1* | 1/2010 | Choi | G11C 13/0069 365/163 |
| 2010/0128512 A1* | 5/2010 | Ohnishi | G11C 7/18 365/145 |
| 2013/0021844 A1 | 1/2013 | Pyeon | |
| 2016/0071583 A1* | 3/2016 | Murooka | G11C 13/0026 365/51 |
| 2017/0263313 A1* | 9/2017 | Chou | G11C 11/1653 |
| 2019/0043585 A1 | 2/2019 | Banerjee et al. | |
| 2019/0088289 A1* | 3/2019 | Ishii | G11C 11/1659 |
| 2019/0096482 A1* | 3/2019 | Zeng | G11C 13/0026 |
| 2019/0103161 A1 | 4/2019 | Chevallier et al. | |

* cited by examiner

210d

RESISTIVE MEMORY DEVICES AND METHODS OF OPERATING RESISTIVE MEMORY DEVICES INCLUDING ADJUSTMENT OF CURRENT PATH RESISTANCE OF A SELECTED MEMORY CELL IN A RESISTIVE MEMORY DEVICE

CROSS-REFERENCE TO RELATED APPLICATIONS

This US application claims the benefit of priority under 35 USC § 119 to Korean Patent Application No. 10-2019-0085541, filed on Jul. 16, 2019, in the Korean Intellectual Property Office, the disclosure of which is incorporated by reference in its entirety herein.

BACKGROUND

Example embodiments relate to memories, and more particularly to resistive memory devices, and/or methods of operating resistive memory devices.

Volatile memory is a type of computer storage that only maintains its data while the device is powered. Non-volatile memory is a type of computer storage that can retrieve stored information even after having been power cycled, e.g. after loss of power. Research into next-generation memory devices that are non-volatile and do not require refresh operations is being conducted in response to demand for high capacity and low power consumption memory devices. Next-generation memory devices generally require/include the high integrity characteristics of Dynamic Random Access Memory (DRAM), the non-volatile characteristics of flash memory, and the high speed of static RAM (SRAM). Examples of next-generation memory devices include Phase change RAM (PRAM), Nano Floating Gate Memory (NFGM), Polymer RAM (PoRAM), Magnetic RAM (MRAM), Ferroelectric RAM (FeRAM), and/or Resistive RAM (RRAM).

SUMMARY

At least some example embodiments of inventive concepts provides a resistive memory device having increased performance and endurance.

At least some example embodiments of inventive concepts provides a method of operating a resistive memory device to have increased performance and endurance.

According to some example embodiments of inventive concepts, a resistive memory device includes a memory cell array including a plurality of resistive memory cells, the plurality of resistive memory cells being connected to a plurality of word-lines and to a plurality of bit-lines, a write/read circuit connected to the memory cell array through a row decoder and through a column decoder, the write/read circuit configured to perform a write operation to write write data in a target page of the memory cell array, and configured to verify the write operation by comparing read data read from the target page with the write data, and a control circuit configured to control at least one of the row decoder, the column decoder, or the write/read circuit, the control circuit configured to control a resistance which a selected memory cell experiences, the resistance based on a distance from an access point to the selected memory cell in the memory cell array, the distance based on an address.

According to some example embodiments of inventive concepts, a resistive memory device includes a memory cell array including a plurality of resistive memory cells connected to a plurality of word-lines and to a plurality of bit-lines, a row decoder connected to the memory cell array through the plurality of word-lines, the row decoder including a plurality of row selection switches, a column decoder connected to the memory cell array through the plurality of bit-lines, the column decoder including a plurality of column selection switches, a write/read circuit connected to the memory cell array through the row decoder and the column decoder, the write/read circuit configured to perform a write operation to write write data in a target page of the memory cell array, and configured to verify the write operation by comparing read data read from the target page with the write data, and a control circuit configured to control at least one of the row decoder, the column decoder, or the write/read circuit, the control circuit configured to control a resistance which a selected memory cell experiences according to a distance from an access point to the selected memory cell in the memory cell array, the distance based on an address.

According to some example embodiments of inventive concepts, there is provided a method of operating a memory device including a method of operating a memory device including a memory cell array that includes a plurality of resistive memory cells, the method comprising, determining one of the plurality of resistive memory cells as a selected memory cell based on a row address and a column address, applying a program current to the selected memory cell during a program operation while adjusting a level of a first voltage applied to a gate of a row selection switch and adjusting a level of a second voltage applied to a gate of a column selection switch, the adjusting the level of the first voltage a of the second voltage being differently based on a distance from an access point to the selected memory cell in the memory cell array, wherein the row selection switch is connected to a word-line connected to the selected memory cell, and wherein the column selection switch is connected to a bit-line connected to the selected memory cell.

According to at least some example embodiments of inventive concepts, the resistive memory device may adjust a resistance value which a selected memory cell experiences based on a distance of the selected memory cell from an access point. Therefore, overshoot that occurs in the memory cells near the access point may be reduced. Accordingly, the resistive memory device may increase performance and/or endurance.

BRIEF DESCRIPTION OF THE DRAWINGS

Example embodiments of inventive concepts will be described below in more detail with reference to the accompanying drawings.

DETAILED DESCRIPTION OF EXAMPLE EMBODIMENTS

Inventive concepts will be described more fully hereinafter with reference to the accompanying drawings, in which example embodiments thereof are shown. As used in the specification, the singular forms "a", "an" and "the" are intended to include the plural forms as well unless the context clearly indicates otherwise.

Figure 1:
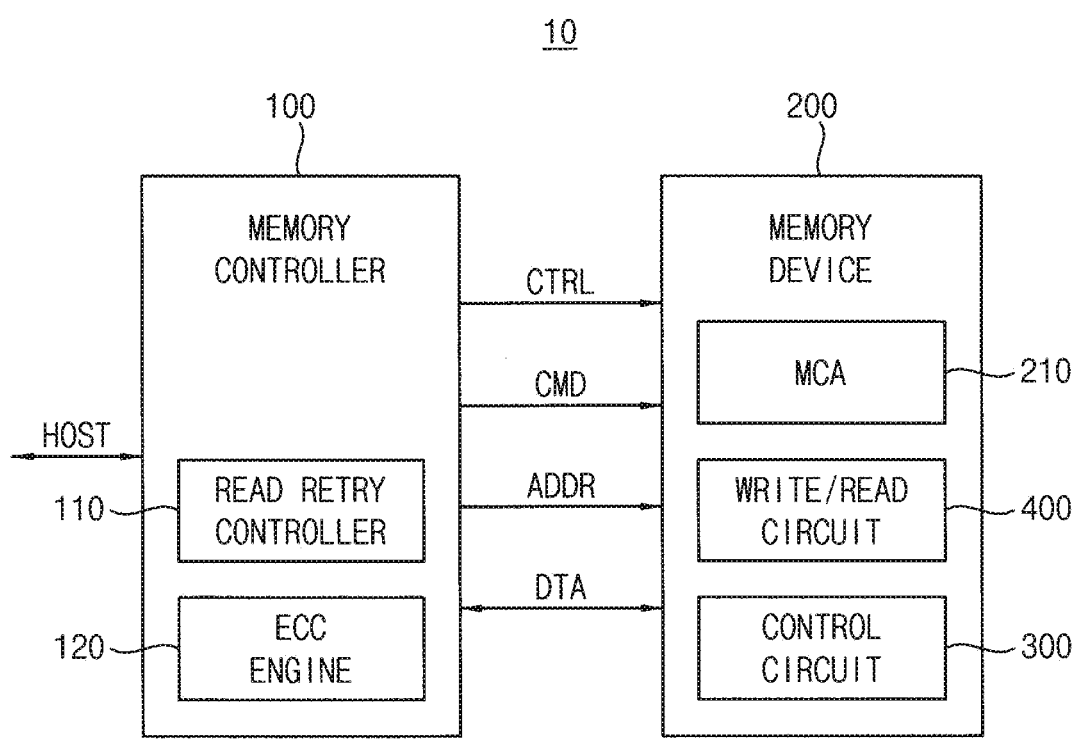
FIG. 1 is a block diagram illustrating a memory system according to some example embodiments of inventive concepts.

FIG. 1 is a block diagram illustrating a memory system according to some example embodiments of inventive concepts.

In example embodiments, a memory device may be referred to as a resistive type memory device because the memory device includes resistive type memory cells. Alternatively or additionally, the memory device may include various types of memory cells. For example, the memory device may include a heterogeneous collection of memory cells. Since the memory cells may be disposed at cross-points of multiple first signal lines and multiple second signal lines, the memory device may be referred to as a cross-point memory device.

Referring to FIG. 1, a memory system 10 includes a memory controller 100 and a resistive memory device 200. Either or both of the memory controller 100 and the resistive memory device may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The resistive memory device 200 includes a memory cell array 210, a control circuit 300, and a write/read circuit 400. When the memory cell array 210 includes a plurality of resistive type memory cells, the memory system 10 may be referred to as a resistive (type) memory system.

In response to a write/read request from a host, the memory controller 100 reads data stored in the resistive memory device 200 and/or controls the resistive memory device 200 to write data to the resistive memory device 200. In some example embodiments, the memory controller 100 provides an address (signal) ADDR, a command (signal) CMD, and a control signal CTRL to the resistive memory device 200 to control a program (or write) operation and/or a read operation with respect to the resistive memory device 200.

In addition, write-target data DTA and read data DTA may be exchanged between the memory controller 100 and the resistive memory device 200. For example, the write-target data DTA can be written to the resistive memory device 200 in response to a write command and the read data DTA can be read from the resistive memory device 200 in response to a read command.

In addition, the memory controller 100 may include a read-retry controller 110 (e.g., a control circuit) and/or an error correction code (ECC) engine 120 (e.g., an ECC circuit). The ECC engine 120 may perform error detection and correction on data that is provided from the resistive memory device 200. For example, the ECC engine 120 can detect whether the data has an error and potentially correct the error. However, inventive concepts are not limited thereto, and the memory controller 100 may not include a read-retry controller 110 or an ECC engine 120. The ECC engine 120 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although not illustrated, the memory controller 100 may include a random access memory (RAM), a processing unit, a host interface, and/or a memory interface. The RAM may be used as an operation memory of the processing unit. The processing unit may control operations of the memory controller 100. The host interface may include a protocol for exchanging data between the host and the memory controller 100.

The memory cell array 210 may include includes a plurality of memory cells (not shown) that are disposed respectively in regions where first signal lines and second signal lines cross. In addition, each of the memory cells may be a single level cell (SLC) that stores one bit data, or may be a multilevel cell (MLC) that stores at least two-bit data.

Alternatively, the memory cell array 210 may include both the SLCs and the MLCs. When one bit data is written to one memory cell, the memory cells may have two resistance level distributions according to the written data. Alternatively, when two-bit data is written to one memory cell, the memory cells may have four resistance level distributions according to the written data. In some example embodiments, when a memory cell is a triple level cell (TLC) that stores three-bit data, the memory cells may have eight resistance level distributions according to the written data. However, embodiments of inventive concepts are not limited thereto. For example, each of the memory cells may store at least four-bit data in another embodiment.

In some example embodiments, the memory cell array 210 includes memory cells with a two-dimensional horizontal structure. Alternatively or additionally, the memory cell array 210 includes memory cells with a three-dimensional vertical structure.

The memory cell array 210 may include resistive-type (resistive) memory cells that include a variable resistor element (not shown). For one example, when resistance of the variable resistor element that is formed of a phase change material (e.g., Ge—Sb—Te) is changed according to a temperature, a resistive memory device is a phase change RAM (PRAM). As another example, when the variable resistor device is formed of a complex metal oxide including an upper electrode, a lower electrode, and a transition metal oxide therebetween, the resistive memory device is a resistive RAM (RRAM). As another example, when the variable resistor device is formed of an upper electrode of a magnetic material, a lower electrode of the magnetic material, and a dielectric therebetween, the resistive memory device is a magnetic RAM (MRAM). The memory cell array 210 may include a heterogeneous collection of resistive-type memory cells; for example, the memory cell array 210 may include a PRAM cell, an RRAM cell, and an MRAM cell; however, inventive concepts are not limited thereto.

The write/read circuit 400 performs a write operation and a read operation on the memory cells. In some example embodiments, the write/read circuit 400 is connected to the memory cells through bit-lines, and includes write drivers (e.g., driving circuits) that write data to the memory cells, and sense amplifiers that sense resistive components of the memory cells.

In some example embodiments, the control circuit 300 controls operations of the resistive memory device 200, and controls the write/read circuit 400 so as to perform a memory operation such as a write operation or a read operation. For the write and read operations of the resistive memory device 200, the control circuit 300 may provide pulse signals such as a write pulse or a read pulse to the write/read circuit 400. For example, the write/read circuit 400 may provide a write current (or a write voltage) in response to the write pulse to the memory cell array 210 and provide a read current (or a read voltage) in response to the read pulse to the memory cell array 210. The read current/write current or the read voltage/write voltage may be the same as, or different from, each other.

In the write operation with respect to the resistive memory device 200, a resistance value of a variable resistor of a memory cell of the memory cell array 210 may be increased or decreased, depending on write data associated with the write operation. For example, each of the memory cells of the memory cell array 210 may have a resistance value according to data that is currently stored therein, and the resistance value may be increased or decreased, depending on data to be written to each of the memory cells. In some example embodiments, the write operation is divided into a reset write operation and a set write operation. In a set state, a resistive memory cell may have a relatively low resistance value, and in a reset state, the resistive memory cell may have a relatively high resistance value. The reset write operation may involve performing a write operation so as to increase a resistance value of a variable resistor of the resistive memory cell, and the set write operation may involve performing a write operation so as to decrease the resistance value of the variable resistor of the resistive memory cell.

In some example embodiments, when a detected error of data read by the resistive memory device 200 is not correctable, the memory controller 100 controls the resistive memory device 200 to operate in a read-retry mode to perform a read-retry operation. For example, the ECC engine 120 can determine whether the data read has an error and whether that error is correctable. During the read-retry operation, the memory device 200 reads (or re-reads) data while the memory device 200 changes a reference (e.g., a read reference) for determining data "0" and data "1", analyzes a valley in a resistance level distribution of memory cells by performing a data determination operation on the read data, and based on the analysis result, performs a recovery algorithm of selecting a read reference so as to minimize or reduce error occurrence of the data.

Figure 2:
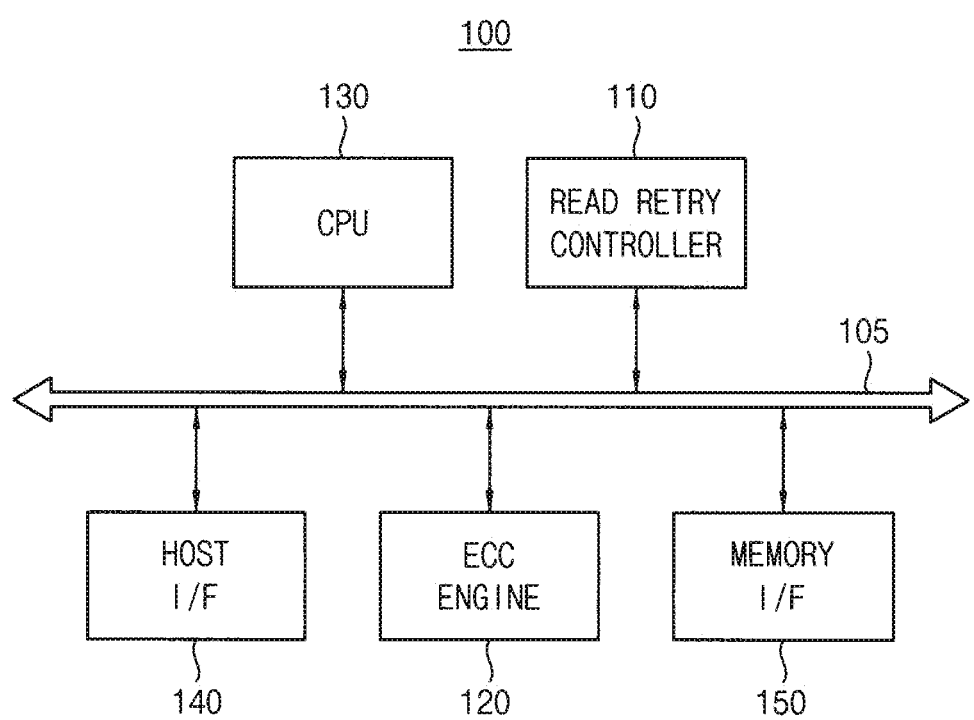
FIG. 2 is a block diagram illustrating the memory controller in FIG. 1 according to some example embodiments of inventive concepts.

FIG. 2 is a block diagram illustrating the memory controller in FIG. 1 according to some example embodiments of inventive concepts.

Referring to FIG. 2, the memory controller 100 includes the read-retry controller 110, the ECC engine 120, a central processing unit (CPU) 130, a host interface 140, and a memory interface 150. The read-retry controller 110, the ECC engine 120, the central processing unit (CPU) 130, the host interface 140, and the memory interface 150 may communicate with one another through a data bus 105.

The CPU 130 controls operations of the memory controller 100. For example, the CPU 130 may control various function blocks related to a memory operation on the resistive memory device 200. The host interface 140 interfaces with the host. Examples of this interfacing include receiving a request for the memory operation from the host. For example, the host interface 140 receives, from the host, requests for reading and/or writing data, and in response to the requests, the host interface 140 generates internal signals for the memory operation on the memory device 200.

In some example embodiments, the ECC engine 120 performs an ECC encoding process on write data and an ECC decoding process on read data. For example, the ECC engine 120 may perform an error detection operation on data that is read from the resistive memory device 200, and may perform an error correction operation on the read data when a result of the error detection operation indicates an error is present. The read-retry controller 110 may provide various types of information for controlling an operation of the memory device 200 during the read-retry mode, as previously described. The memory interface 150 interfaces with the resistive memory device 200 to exchange various signals (e.g., command, address, mode signals, reference information, data, etc.) between the memory controller 100 and the resistive memory device 200.

Figure 3:
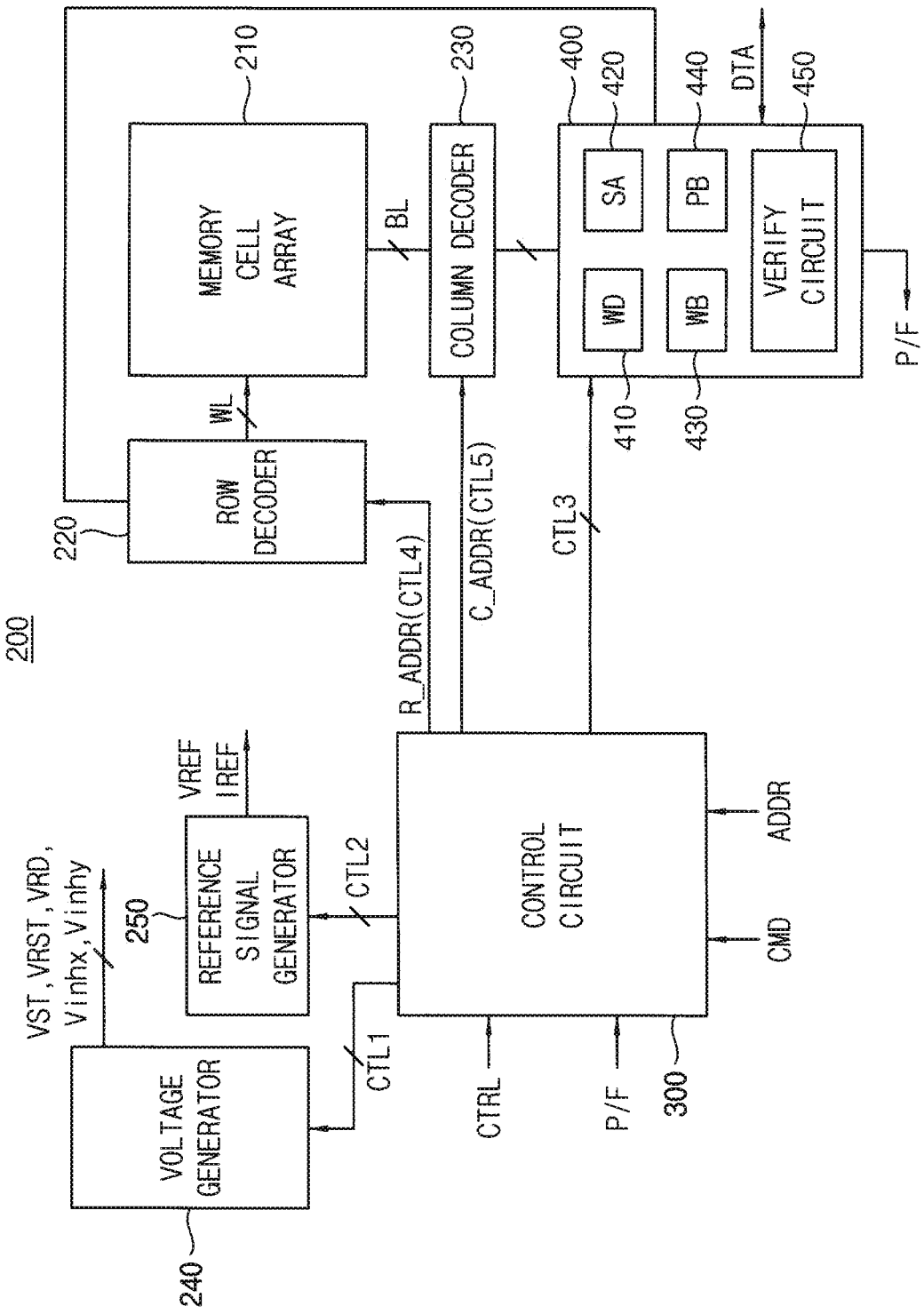
FIG. 3 is a block diagram illustrating the resistive memory device in FIG. 1 according to some example embodiments of inventive concepts.

FIG. 3 is a block diagram illustrating the resistive memory device in FIG. 1 according to some example embodiments of inventive concepts.

Referring to FIG. 3, the resistive memory device 200 includes the memory cell array 210, the control circuit 300, and the write/read circuit 400. The resistive memory device 200 may further include a row decoder 220, a column decoder 230, a voltage generator 240, and a reference signal generator 250. The write/read circuit 400 may include a write driver 410, a sense amplifier including a read circuit 420, a write buffer 430, a page buffer 440, and a verify circuit 450. The write/read circuit 400, including any or all of the write driver 310, the sense amplifier including the read circuit 420, the write buffer 430, the page buffer 440, and the verify circuit 450, may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Memory cells that are arranged in the memory cell array 210 are connected to word-lines WL and bit-lines BL. Since various voltage signals or current signals are provided through the bit-lines BL and the word-lines WL, data may be written to or read from selected memory cells, and writing data to or reading data from residual unselected memory cells may be prevented, or reduced in likelihood of occurrence.

The address (or, access address) ADDR accompanied with the command CMD for indicating an access-target memory cell may be received by the control circuit 300. In some example embodiments, the address ADDR includes a row address R_ADDR for selecting word-lines WL of the memory cell array 210, and a column address C_ADDR for selecting bit-lines BL of the memory cell array 210. The row decoder 220 performs a word-line selecting operation in response to the row address R_ADDR, and the column decoder 230 performs a bit-line selecting operation in response to the column address C_ADDR.

The write/read circuit 400 may be connected to the bit-lines BL and thus may write data to a memory cell or may read data from the memory cell. The write/read circuit 400 may be connected to the row decoder 220 and the column decoder 230, For example, a set voltage VST or a reset voltage VRST may be provided from the voltage generator 240 to a selected memory cell, inhibit voltages Vinhx and Vinhy may be provided from the voltage generator 240 to unselected word-lines and unselected bit-lines, and in a read operation, a read voltage VRD may be provided from the voltage generator 240 to the selected memory cell. The write/read circuit 400 may provide a write voltage or a write current according to data to the memory cell array 210 through the column decoder 230. Alternatively or additionally, in order to determine the data in the read operation, the write/read circuit 400 may include a comparator that is connected to a node (e.g., a data sensing node) of a bit-line BL, and may read a data value by performing a comparison operation on a sensing voltage or a sensing current of the sensing node. A reference voltage VREF and/or a reference current IREF may be provided to the write/read circuit 400 and thus may be used in a data determination operation. The reference signal generator 250 may generate the reference voltage VREF and/or the reference current IREF.

Alternatively or additionally, the write/read circuit 400 may provide the control circuit 300 with a pass/fail signal P/F according to a read result with respect to the read data. The control circuit 300 may refer to the pass/fail signal P/F and thus control write and read operations of the memory cell array 210.

In some example embodiments, the control circuit 300 generates a plurality of control signals CTL1~CTL5 based on the command CMD, the address ADDR, the control signal CTRL and the pass/fail signal P/F. In some example embodiments, the control circuit 300 provides a first control signal CTL1 to the voltage generator 240, provides a second control signal CTL2 to the reference signal generator 250, provides a third control signal CTL3 to the write/read circuit 400, provides a fourth control signal CTL4 to the row decoder 220, and provides a fifth control signal CTL5 to the column decoder 230. Inventive concepts are not limited thereto, and the control circuit 300 may generate fewer than, or more than, the first through fifth control signals CTL1~CTL5.

The control circuit 300 may control at least one of the row decoder 220, the column decoder 230 and the write/read circuit 400 to control a resistance which the selected memory cell experiences according to a distance from an access point to the selected memory cell in the memory cell array 210 based on the row address R_ADDR and/or the column address C_ADDR (e.g., the address ADDR).

Figure 4:
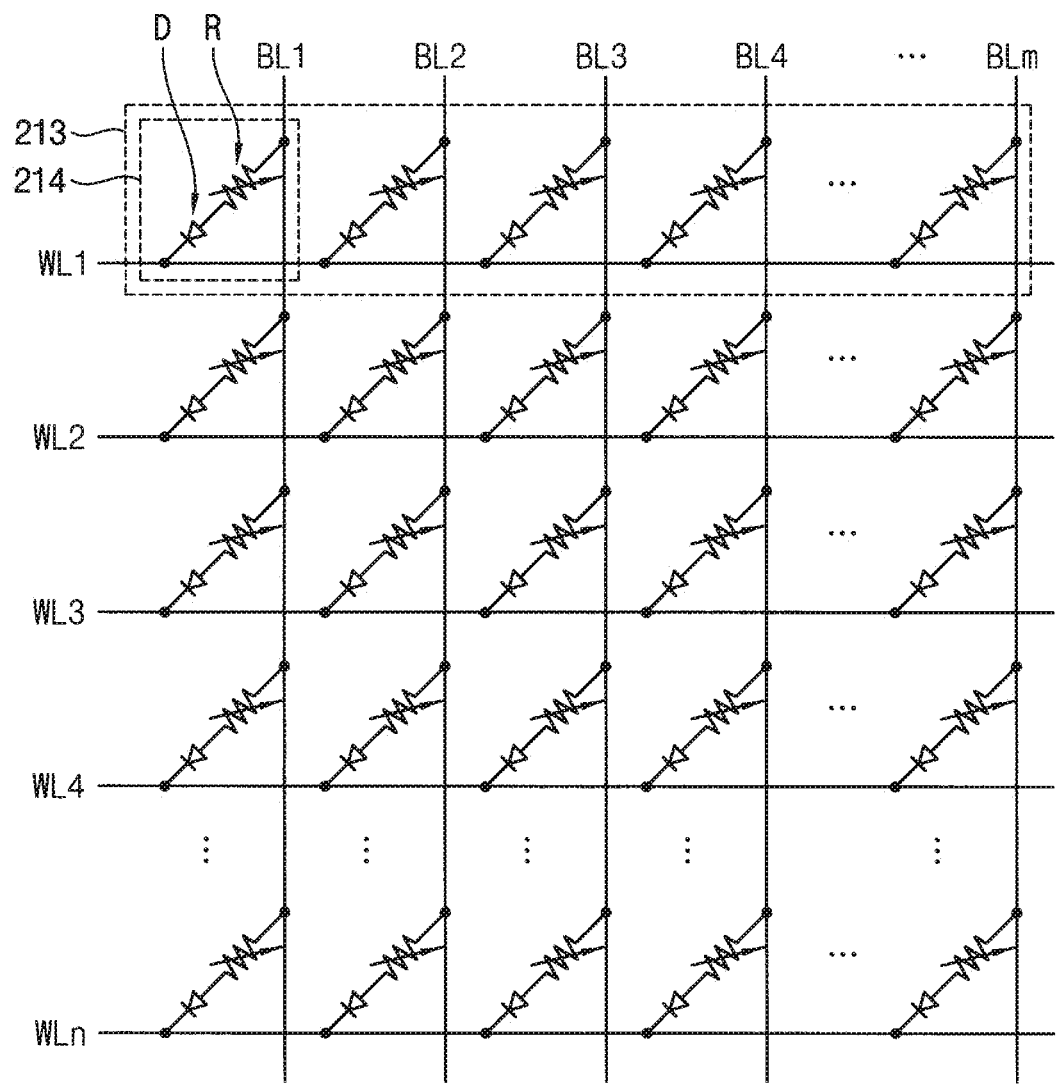
FIG. 4 is a circuit diagram illustrating an example of the memory cell array in FIG. 3 according to some example embodiments of inventive concepts.

FIG. 4 is a circuit diagram illustrating an example of the memory cell array in FIG. 3 according to some example embodiments of inventive concepts.

A memory cell array 210a includes multiple cells, and FIG. 4 shows an example of a cell array having a cell block including these multiple cells.

Referring to FIG. 4, the memory cell array 210a includes multiple word-lines WL1 through WLn, multiple bit-lines BL1 through BLm, and multiple memory cells 214. While FIG. 4 illustrates five word-lines WL, inventive concepts are not limited thereto as there may be fewer than five or more than five word-lines WL. For example, the number n of word lines WL may be the same as, or different from, the number m of bit-lines BL. Furthermore, there may be additional dummy word-lines WL and/or dummy bit-lines BL that are not electrically active during operation of the memory cell array 210a, that may help during the fabrication of the memory cell array 210a. The memory cells MC connected to one word-line may be defined as a page unit 213.

In some example embodiments, each of the memory cells MC includes a variable resistor R and a selection device D. Here, the variable resistor R may be referred to as a variable resistor element and/or a variable resistor material, and the selection device D may be referred to as a switching element. As illustrated in FIG. 4, the switching element may be or include a diode; however, inventive concepts are not limited thereto. The variable resistor R is connected between one of the bit-lines BL1 through BLm and the selection device D, and the selection device D is connected between the variable resistor device R and one of the word-lines WL1 through WLn.

A resistance value of the variable resistor R may be changed to one of multiple resistive states. For example, the resistance value may change in response to an electric pulse being applied to the corresponding variable resistor R. In some example embodiments, the variable resistor R includes a phase-change material having a crystal state that changes according to a current. The phase-change material may include materials, such as at least one of GaSb, InSb, InSe, or $Sb_2Te_3$ obtained by compounding two elements, GeSbTe, GaSeTe, InSbTe, $SnSb_2Te_4$, or InSbGe obtained by compounding three elements, or AgInSbTe, (GeSn)SbTe, GeSb (SeTe) obtained by compounding four elements.

In some example embodiments, the phase-change material has an amorphous state that is relatively high-resistive, and a crystal state that is relatively low-resistive. A phase of the phase-change material may be changed by Joule heat that is generated by the current. Using changes of the phase, data may be written to the corresponding cell.

In some example embodiments, the variable resistor R does not include the phase-change material, but includes at least one of perovskite compounds, transition metal oxide, magnetic materials, ferromagnetic materials, or antiferromagnetic materials, for example.

The selection device D is connected between one of the word-lines WL1 through WLn and the variable resistor R, and according to a voltage applied to the connected word-line and bit-line, a current that is supplied to the variable resistor R is controlled. In some example embodiments of inventive concepts, the selection device D is a PN-junction diode or a PIN-junction diode. An anode of the diode may be connected to the variable resistor R, and a cathode of the diode may be connected to one of the word-lines WL1 through WLn. Here, when a voltage difference between the anode and the cathode of the diode is greater than a threshold voltage of the diode, for example is greater than 0.7 volts, the diode is turned on so that the current is supplied to the variable resistor R. Conversely, when the voltage difference between the anode and the cathode of the diode is less the threshold voltage of the diode, for example is less than 0.7 volts, the diode is turned off.

Figure 5A:
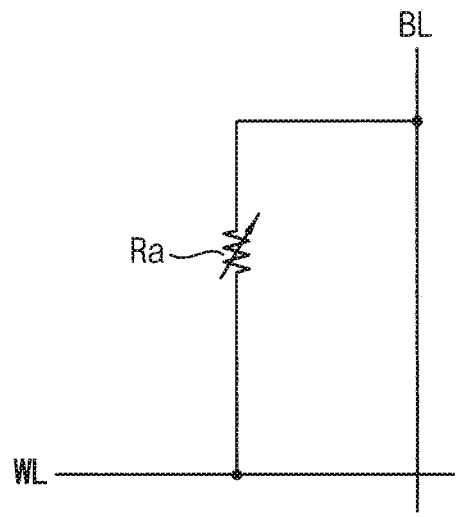
FIGS. 5A through 5C are circuit diagrams of examples of a memory cell in FIG. 4.
Figure 5B:
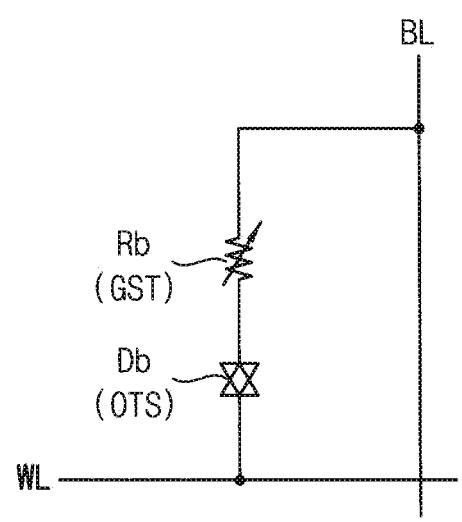
Figure 5C:
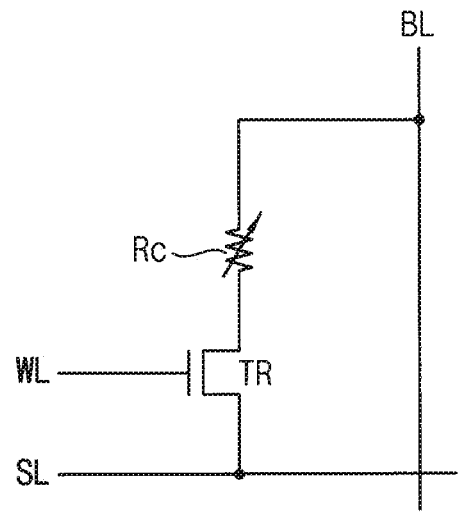

FIGS. 5A through 5C are circuit diagrams of examples of a memory cell in FIG. 4.

Referring to FIG. 5A, a memory cell 214a includes a variable resistor Ra connected between, e.g. directly connected between, a bit-line BL and a word-line WL. The memory cell 214a stores data due to voltages that are applied to the bit-line BL and the word-line WL, respectively.

Referring to FIG. 5B, a memory cell 214b includes a variable resistor Rb and a bidirectional diode Db. The variable resistor Rb includes a resistive material so as to store data. The bidirectional diode Db is connected between, e.g. directly connected between, the variable resistor Rb and a word-line WL, and the variable resistor Rb is connected between, e.g. directly connected between, a bit-line BL and the bidirectional diode Db. Alternatively, positions of the bidirectional diode Db and the variable resistor Rb are changed with respect to each other. By using the bidirectional diode Db, leakage current that may flow through a non-selected resistor cell may be cut (e.g., eliminated or reduced). The variable resistor Rb may include a phase change material such as GeSbTe (GST) and the bidirectional diode Db may include an ovonic threshold switch (OTS).

Referring to FIG. 5C, a memory cell 214c includes a variable resistor Rc and a transistor TR. The transistor TR is a selection device (e.g., a switching device), which supplies or cuts a current to the variable resistor Rc, according to a voltage of a word-line WL. As illustrated in FIG. 5C, in addition to the word-line WL, a source line SL is additionally arranged to adjust voltage levels at both ends of the variable resistor Rc. The transistor TR is connected between the variable resistor Rc and the source line SL, and the variable resistor Rc is connected between (e.g. directly connected between) a bit-line BL and the transistor TR. Alternatively, positions of the transistor TR and the variable resistor Rc are changed with respect to each other. The memory cell 214c is selected or not selected according to the ON or OFF state of the transistor TR that is driven by the word-line WL. The memory cell array 210a may include memory cells in a heterogeneous fashion; for example, the memory cell array 210 may include memory cells 214a, memory cells 214b, and/or memory cells 214c; however, inventive concepts are not limited thereto.

Figure 6:
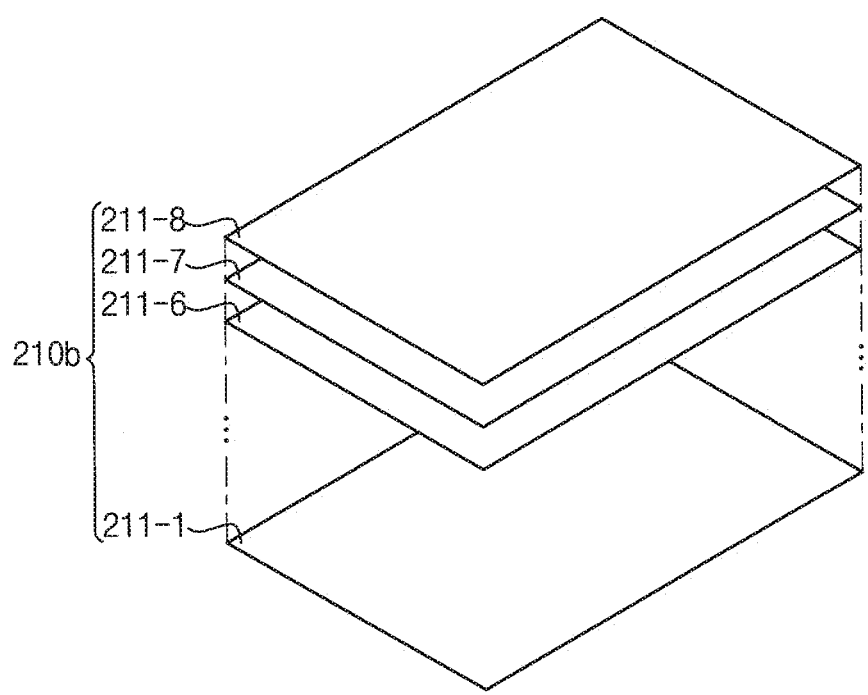
FIG. 6 is a diagram illustrating another example of the memory cell array in FIG. 3.

FIG. 6 is a diagram illustrating an example of the memory cell array in FIG. 3.

Referring to FIG. 6, a memory cell array 210b is implemented with a three-dimensional stacked structure. The example three-dimensional stacked structure includes multiple, vertically stacked, memory cell layers 211_1~211_8. However, those of ordinary skill in the art will understand that the number of vertically stacked memory cell layers is an arbitrary one.

Each of the memory cell layers 211_1~211_8 may include a normal cell array and a redundancy cell array. When the memory cell array 210b has a three-dimensional laminated structure, each of the memory cell layers 211_1~211_8 has the cross point structure illustrated in FIG. 4.

Figure 7A:
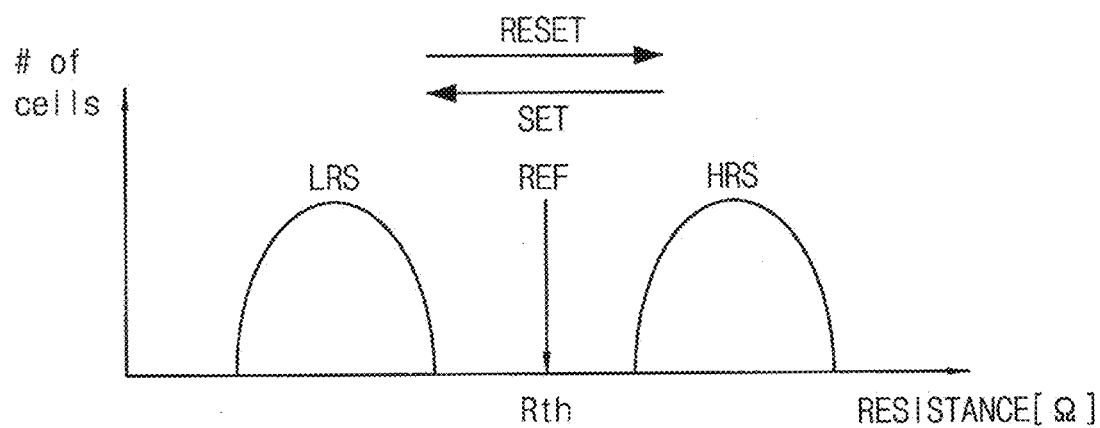
FIG. 7A illustrates a graph showing an example of a distribution of a memory cell with respect to a resistance when the memory cell of FIG. 4 is a single-level cell.

FIG. 7A illustrates a graph showing an example of a distribution of a memory cell with respect to a resistance when the memory cell of FIG. 4 is a single-level cell.

Referring to FIG. 7A, a horizontal axis denotes a resistance, and a vertical axis denotes a number of memory cells. For example, if a memory cell (for example, the memory cell 124) is a single-level cell to which 1 bit is programmed, the memory cell can have a low resistance state LRS. Inventive concepts are not limited thereto, and a memory cell may be a cell to which 1 is programmed while the memory cell has a high resistance state HRS. A set operation, e.g. a set write operation, refers to a switching operation for the memory cell 124 from the high resistance state HRS to the low resistance state LRS by applying a write pulse to the memory cell. In addition, a reset operation, e.g. a reset write operation, refers to a switching operation for the memory cell from the low resistance state LRS to the high resistance state HRS by applying a write pulse to the memory cell.

A threshold resistance Rth may be set as a resistance between the distribution of the low resistance state LRS and the distribution of the high resistance state HRS. In a read operation performed on a memory cell, when a read result is greater than or equal to the threshold resistance Rth, the read result may be determined to be the high resistance state HRS, and when the read result is less than threshold resistance Rth, the read result may be determined to be the low resistance state LRS. In some example embodiments, information on a read reference REF corresponding to the threshold resistance Rth is received from the memory controller 100. For example, the information may be used to determine the threshold resistance Rth of a memory cell. Cells with a resistance value of less than Rth may correspond to cells with a logic value of "0", while cells with a resistance value of greater than or equal to Rth may correspond to cells with a logic value of "1"; however, inventive concepts are not limited thereto.

Figure 7B:
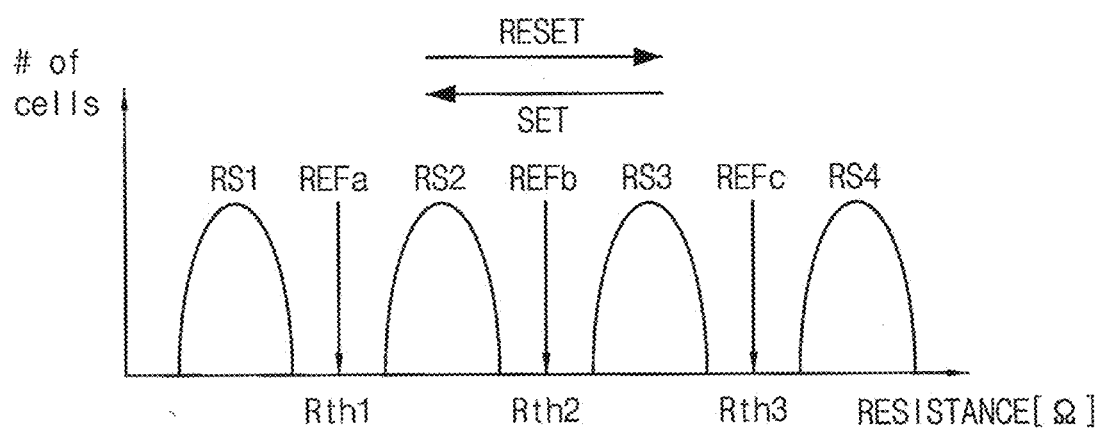
FIG. 7B illustrates a graph showing an ideal distribution of a memory cell with respect to a resistance when the memory cell of FIG. 4 is a multi-level cell.

FIG. 7B illustrates a graph showing an ideal distribution of a memory cell with respect to a resistance when the memory cell of FIG. 4 is a multi-level cell.

Referring to FIG. 7B, the horizontal axis denotes resistance, and the vertical axis denotes the number of memory cells. For example, if a memory cell is a multi-level cell to which 2 bits are programmed, the memory cell may have one of a first resistance state RS1, a second resistance state RS2, a third resistance state RS3, and a fourth resistance state RS4. In an embodiment, the first resistance state RS1 and the second resistance state RS2 may be referred to as a low resistance state while the third resistance state RS3 and the fourth resistance state RS4 may be referred to as a high resistance state.

A resistance between the distribution of the first resistance state RS1 and the distribution of the second resistance state RS2 may be set to be a first threshold resistance Rth1; a resistance between the distribution of the second resistance state RS2 and the distribution of the third resistance state RS3 may be set to be a second threshold resistance Rth2; and a resistance between the distribution of the third resistance state RS3 and the distribution of the fourth resistance state RS4 may be set to be a third threshold resistance Rth3. In a read operation performed on the memory cells 214, when a read result is equal to or greater than the first threshold resistance Rth1, the read result may be determined to be one of the second to fourth resistance states RS2, RS3, and RS4, and when the read result is less than the first threshold resistance Rth1, the read result may be determined to be the first resistance state RS1. In an embodiment, information on read references REFa, REFb, and REFc respectively corresponding to the first, second, and third threshold resistances Rth1, Rth2, and Rth3 are received from the memory controller 100. There may be a mapping between logic values of cells and cells with a resistance value less than Rth1, between Rth1 and Rth2, between Rth2 and Rth3, and greater than Rth3. For example, cells with a resistance value of less than Rth1 may be cells with a logic value corresponding to "00", cells with a resistance value between Rth1 and Rth2 may be cells with a logic value corresponding to "01", cells with a resistance value between Rth2 and Rth3 may be cells with a logic value corresponding to "11", and cells with a resistance value greater than Rth3 may be cells with a logic value corresponding to "10"; however, inventive concepts are not limited thereto, and there may be other such mappings.

Figure 8A:
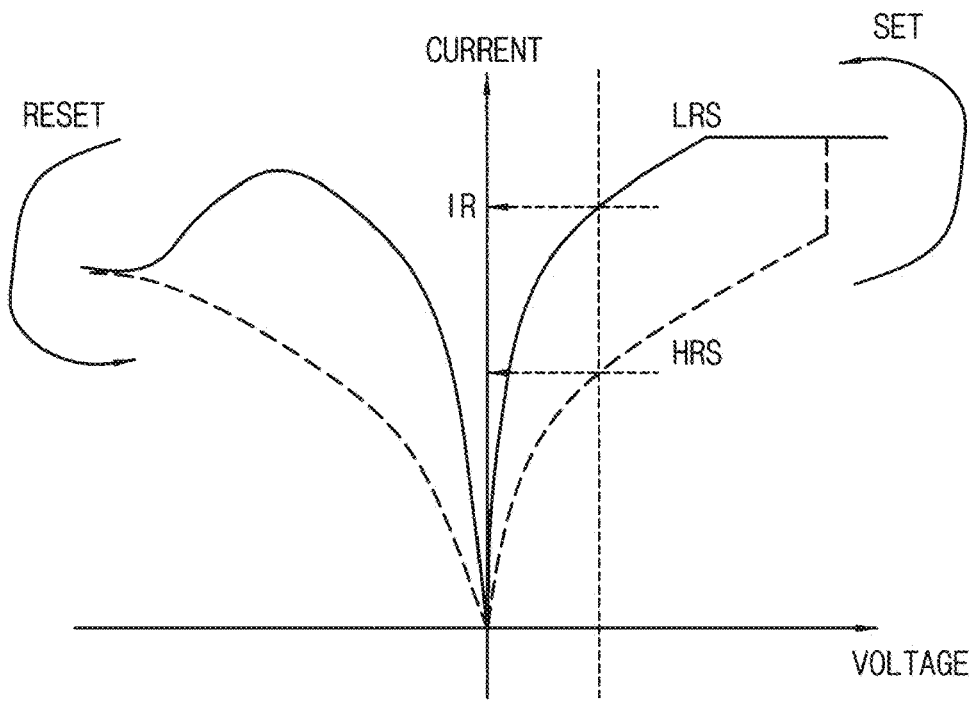
FIG. 8A illustrates a graph showing a current and voltage characteristic curve of the memory cell in FIG. 4.

FIG. 8A illustrates a graph showing a current and voltage characteristic curve of the memory cell in FIG. 4.

Referring to FIG. 8A, a horizontal axis represents voltage and a vertical axis represents current. The memory cell 214 shows a switching behavior of a set write state from a high resistance state (HRS) to a low resistance state (LRS) as a voltage increases. The memory cell 214 shows a switching behavior of a reset write state from the low resistance state (LRS) to the high resistance state (HRS) as a voltage decreases. The memory cell 214 may determine the low resistance state or the high resistance state by detecting a write current IR at a certain voltage.

Referring to FIG. 8A, the horizontal axis denotes a resistance level RCELL of a memory cell, and the vertical axis denotes a cell current ICELL flowing in the memory cell. The cell current ICELL is inversely proportional to the resistance level RCELL, and thus, the cell current ICELL non-linearly decreases with respect to the resistance level RCELL. In detail, when the resistance level RCELL is low, the cell currents ICELL changes by a relatively large amount in response to a resistance change, whereas when the resistance level RCELL is high, the cell current ICELL changes by a relatively small amount in response to the same change of resistance as stated above. Accordingly, when the resistance level RCELL is high, a sensing margin may dramatically decrease.

Figure 8B:
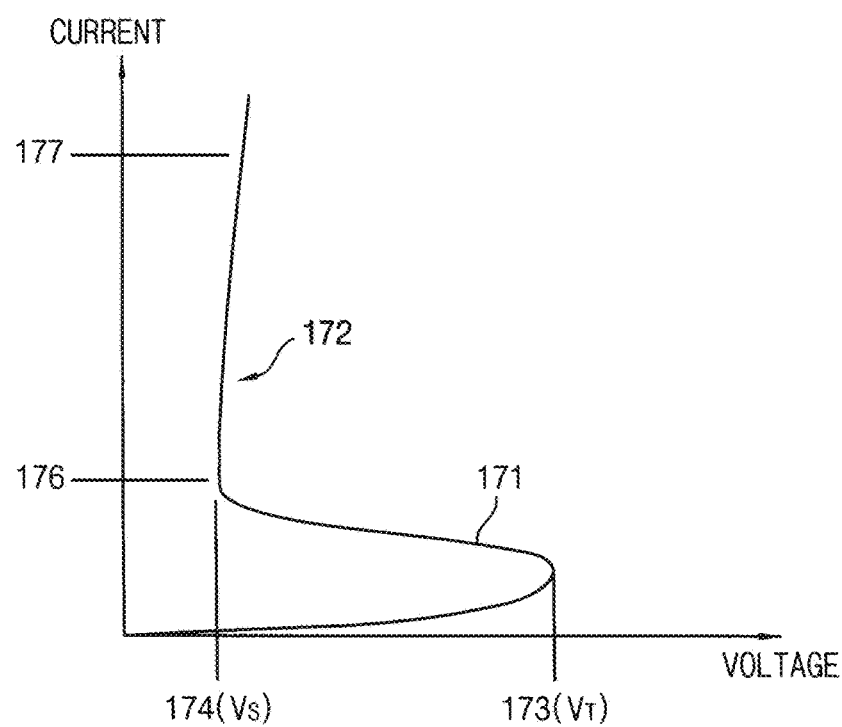
FIG. 8B illustrates a graph showing a current and voltage characteristic curve of the memory cell in FIG. 4.

FIG. 8B illustrates a graph showing a current and voltage characteristic curve of the memory cell in FIG. 4.

Referring to FIG. 8B, a first curve 171 shows a voltage-current relationship in a state when no current flows through the selection device D in FIG. 4. The selection device D may serve as a switching device having the threshold voltage Vt of a first voltage level 173. When both a voltage and current are 0 and the voltage gradually increases, current may hardly flow through the selection device D until the voltage reaches the threshold voltage Vt, e.g., the first voltage level 163. However, as soon as the voltage exceeds the threshold voltage Vt, the current flowing through the selection device D may be rapidly increased, and the voltage applied to the selection device D may decease to a saturation voltage Vs, e.g., a second voltage level 174.

A second curve 172 indicates a voltage-current relation in a state when current flows through the selection device D. As the current flowing through the selection device D increases to be greater than a first current level 176, the voltage applied to the selection device D may increase to be slightly greater than the second voltage level 174. For example, while the current flowing through the selection device D considerably increases from the first current level 176 to a second current level 177, the voltage applied to the selection device D may only slightly increase from the second voltage level 174. For example, once the current starts to flow through the selection device D, the voltage applied to the selection device D may be almost maintained at the saturation voltage Vs. When the current decreases below a holding current level, e.g., the first current level 176, the selection device D may be converted back to a resistance state, and thus the current may be effectively blocked until the voltage increases to the threshold voltage Vt.

Figure 9:
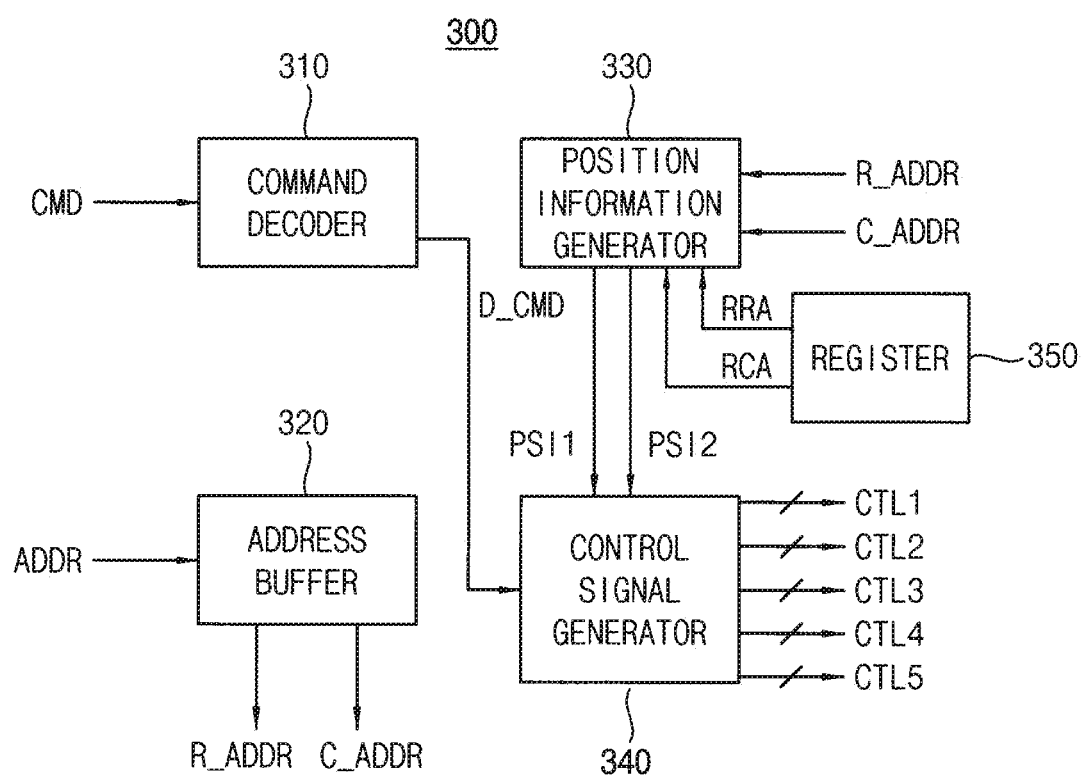
FIG. 9 is a block diagram illustrating an example of the control circuit in the resistive memory device of FIG. 3 according to some example embodiments of inventive concepts.

FIG. 9 is a block diagram illustrating an example of the control circuit in the resistive memory device of FIG. 3 according to some example embodiments of inventive concepts.

Referring to FIG. 9, the control circuit 300 includes a command decoder 310, an address buffer 320, a position information generator 330, a control signal generator 340 and a register 350.

The command decoder 310 decodes the command CMD to generate a decoded command D_CMD, and provides the decoded command D_CMD to the control signal generator 340.

The address buffer 320 receives the address ADDR, provides the row address R_ADDR to the row decoder 220 and the position information generator 330, and provides the column address C_ADDR to the column decoder 230 and the position information generator 330.

The position information generator 330 receives the row address R_ADDR and the column address C_ADDR, compares the row address R_ADDR with a first reference address RRA, compares the column address C_ADDR with a second reference address RCA, and generates position information PSI1 and PSI2 indicating a distance of the selected memory cell from the access point, designated by the row address R_ADDR and the column address C_ADDR. The position information generator 330 provides position information PSI1 and PSI2 to the control signal generator 340.

The position information PSI1 may include a first distance information of the selected memory cell in a row direction from the row decoder 220 and the position information PSI2 may include a second distance information of the selected memory cell in a column direction from the column decoder 230. The position information PSI1 may include a first distance information of the selected memory cell in a row direction from a row selection switch (e.g., a first access point) to select a word-line (selected word-line) connected to, e.g. coupled to and/or directly connected to, the selected memory cell. The position information PSI2 may include a second distance information of the selected memory cell in a column direction from a column selection switch (i.e., a second access point) to select a bit-line (selected word-line) connected to, e.g. coupled to and/or directly connected to, the selected memory cell. The position information PSI1 may be in units of word-lines, and the position information PSI2 may be in units of bit-lines; however, inventive concepts are not limited thereto. For example, the position information PSI1 may be based on a resistivity and/or sheet resistance of a metal layer corresponding to the word-lines WL, and the position information PSI2 may be based on a resistivity and/or sheet resistance of a metal layer corresponding to the bit-lines BL. A function of the position information PSI1 and PSI2 may be calculated, and called a calculated position information. For example, the calculated position information may correspond to a Euclidean distance between the selected memory cell and an address corresponding to an origin point, e.g. to a specific row address and a specific column address. Alternatively, the calculated position information may correspond to a taxicab distance between the selected memory cell and an address corresponding to the origin point. Inventive concepts are not limited thereto.

The register 350 stores the first reference address RRA and the second reference address RCA and provides the first reference address RRA and the second reference address RCA to the position information generator 330.

The control signal generator 340 receives the decoded command D_CMD and the position information PSI1 and PSI2, and may receive or calculate the calculated position information, and generates the first through fifth control signals CTL1~CTL5 based on an operation designated by the decoded command D_CMD and the distance of the selected memory cell from the access point, which the position information PSI1 and PSI2, and/or the calculated position information, indicate.

The control signal generator 340 provides the first control signal CTL1 to the voltage generator 240, provides the second control signal CTL2 to the reference signal generator 250, provides the third control signal CTL3 to the write/read circuit 400, provides the fourth control signal CTL4 to the row decoder 220 and provides the fifth control signal CTL5 to the column decoder 230.

Figure 10:
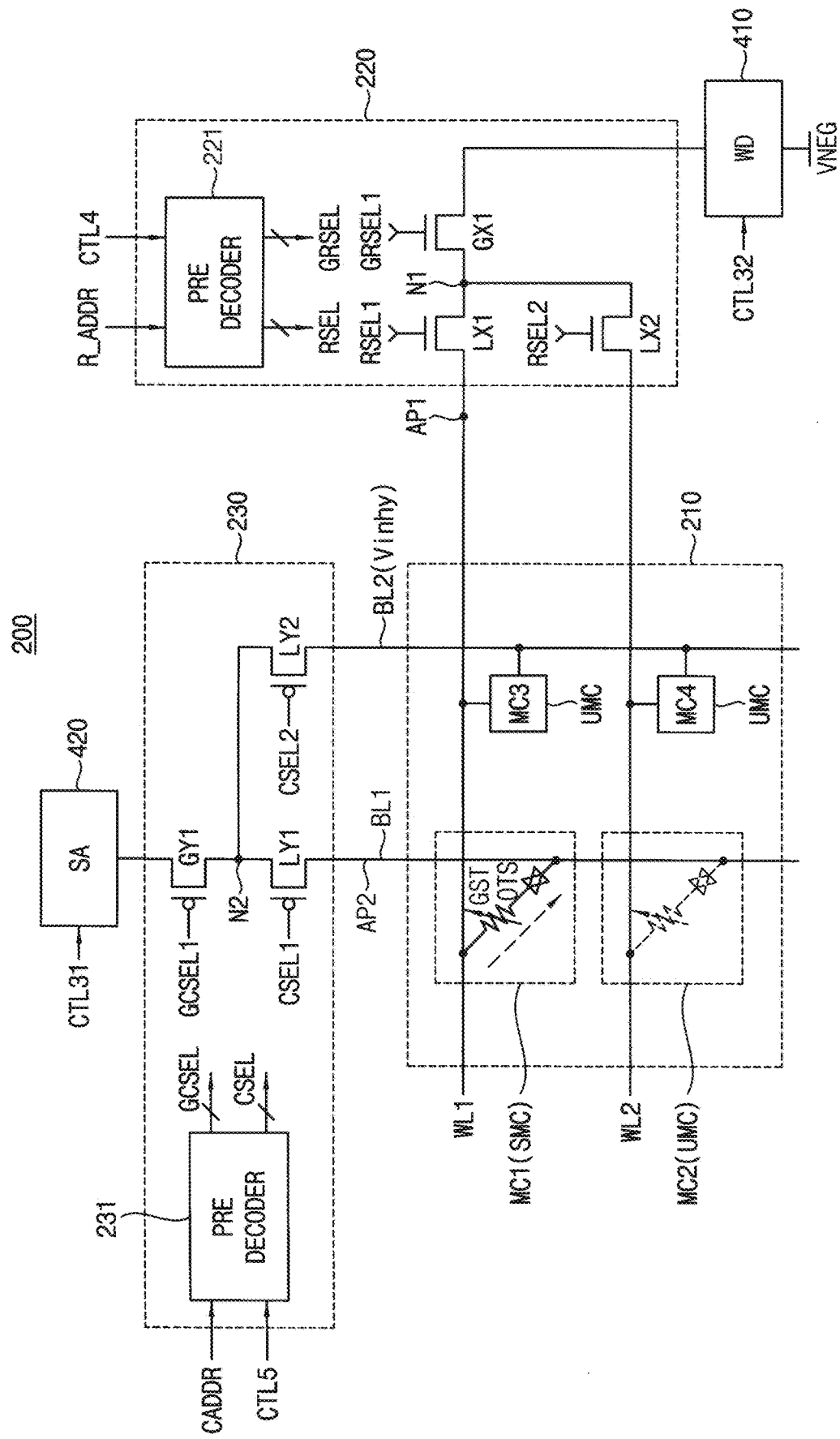
FIG. 10 illustrates a portion of the resistive memory device in FIG. 3 according to some example embodiments of inventive concepts.

FIG. 10 illustrates a portion of the resistive memory device in FIG. 3 according to some example embodiments of inventive concepts.

Referring to FIG. 10, the resistive memory device 200 includes the memory cell array 210, the row decoder 220, the column decoder 230, the write driver 410 and the read circuit 420.

FIG. 10 illustrates the memory cell array 210 including memory cells MC1, MC2, MC3 and MC4 connected to (e.g. coupled to and/or directly connected to) word-lines WL1 and WL2 and bit-lines BL1 and BL2, and it is assumed that the memory cell MC1 is a selected memory cell SMC and each of the memory cells MC1, MC2, MC3 and MC4 are unselected memory cell UMCs. Each of the memory cells MC1, MC2, MC3 and MC4 includes a phase change element GST and a selection element OTS connected to, coupled to, and/or directly connected in series.

Inhibit voltage Vinhx is applied to the word-line WL2 coupled to the unselected memory cells UMCs. Inhibit voltage Vinhy is applied to the bit-line BL2 connected to, coupled to, and/or directly connected to the unselected memory cells UMCs.

The row decoder 220 may include a pre-decoder 221, row selection switches LX1 and LX2, and a global election switch GX1. The pre-decoder 221 decodes the row address R_ADDR and the fourth control signal CTL4 to apply a row selection signals RSEL and a global selection signal GRSEL to the row selection switches LX1 and LX2 and the global row selection switch GX1, respectively. The row selection switches LX1 and LX2 are connected/coupled to the in parallel to the global selection switch GX1 in parallel at a node N1.

The pre-decoder 221 applies a row selection signals RSEL1 with a high level to turn-on the row selection switch LX1, and applies a row selection signals RSEL2 with a low level to turn-off the row selection switch LX2, thereby to select the word-line WL1. The pre-decoder 221 applies global selection signal GRSEL1 with a high level to connect the write driver 410 to the selected word-line WL1. The write driver 410 may be connected between the global election switch GX1 and a negative voltage VNEG and may receive a control signal CTL32 and the control signal CTL32 may be included in the third control signal CTL3.

The column decoder 230 may include a pre-decoder 231, column selection switches LY1 and LY2 and a global election switch GY1. The pre-decoder 231 decodes the column address C_ADDR and the fifth control signal CTL5 to apply a column selection signals CSEL and a global selection signal GCSEL to the column selection switches LY1 and LY2 and the global row selection switch GY1, respectively. The column selection switches LY1 and LY2 are connected/coupled to the in parallel to the global selection switch GY1 in parallel at a node N2.

The pre-decoder 231 applies a column selection signals CSEL1 with a high level to turn-on the column selection switch LY1, and applies a column selection signals CSEL2 with a low level to turn-off the column selection switch LY2 thereby to select the bit-line BL1 and applies global selection signal GCSEL1 with a high level to connect the read circuit 420 to the selected bit-line BL1. The read circuit 420 may receive a control signal CTL31 and the control signal CTL31 may be included in the third control signal CTL3.

The effect due to a set write current or a set write voltage, which the selected memory cell SMC experiences, may be different according to a distance to the selected memory cell SMC from at least one of a first access point AP1 or a second access point AP2. The first access point AP1 corresponds to the row selection switch LX1 to the selected the word-line WL1 connected/coupled to the selected memory cell SMC and the second access point AP2 corresponds to the column selection switch LY1 to selected the bit-line BL1 connected/coupled to the selected memory cell SMC.

Figure 11:
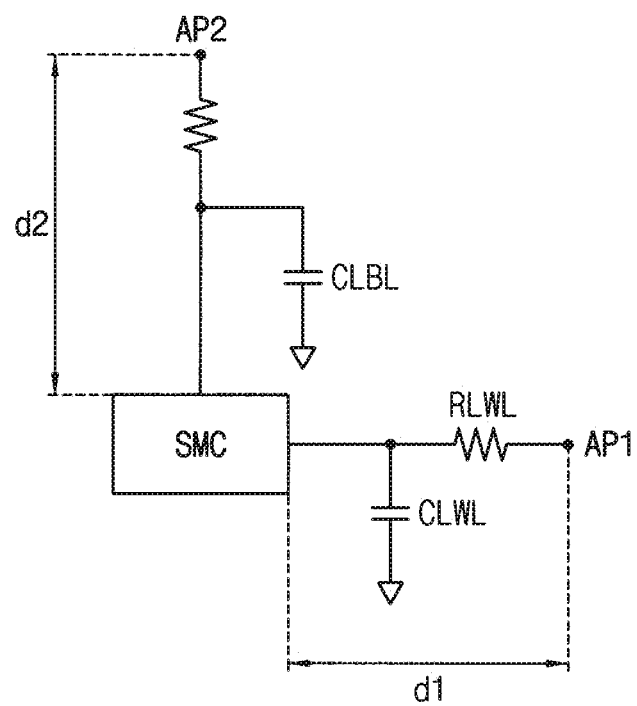
FIG. 11 is a diagram for explaining the selected memory cell and the access point in the resistive memory device of FIG. 10.

FIG. 11 is a diagram for explaining the selected memory cell and the access point in the resistive memory device of FIG. 10.

Referring to FIGS. 10 and 11, when performing a write operation on the selected memory cell SMC in the memory cell array 210, selected by the row address and the column address, unselected memory cells connected/coupled to the word-line connected/coupled to the selected memory cell SMC may be represented by a parasitic resistance component, for example, word-line resistance RLWL. Alternatively or additionally, the word-line may include parasitic capacitance component, for example, word-line capacitance CLWL. The word-line capacitance CLWL may be very small. Alternatively or additionally, unselected memory cells connected/coupled to the bit-line connected/coupled to the selected memory cell SMC may be represented by a parasitic resistance component, for example, bit-line resistance RLBL. Alternatively or additionally, the bit-line may include parasitic capacitance component, for example, bit-line capacitance CLBL. The bit-line capacitance CLBL may be very small.

The resistance value which the selected memory cell SMC experiences may vary according to a first distance d1 from the first access point AP1 to the selected memory cell SMC, and/or a second distance d2 from the second access point AP2 to the selected memory cell SMC. The resistance value which the selected memory cell SMC experiences becomes smaller as the selected memory cell SMC is near to either or both of the access points AP1 and AP2. Therefore, if the write operation is performed on the selected memory cell SMC (e.g. the set current is applied to the selected memory cell SMC) without regard to a position of the selected memory cell SMC in the memory cell array 210, overshoot may occur in memory cells nearer to the access points AP1 and/or AP2, and/or performance and/or endurance of the resistive memory device 200 may be degraded.

Figure 12:
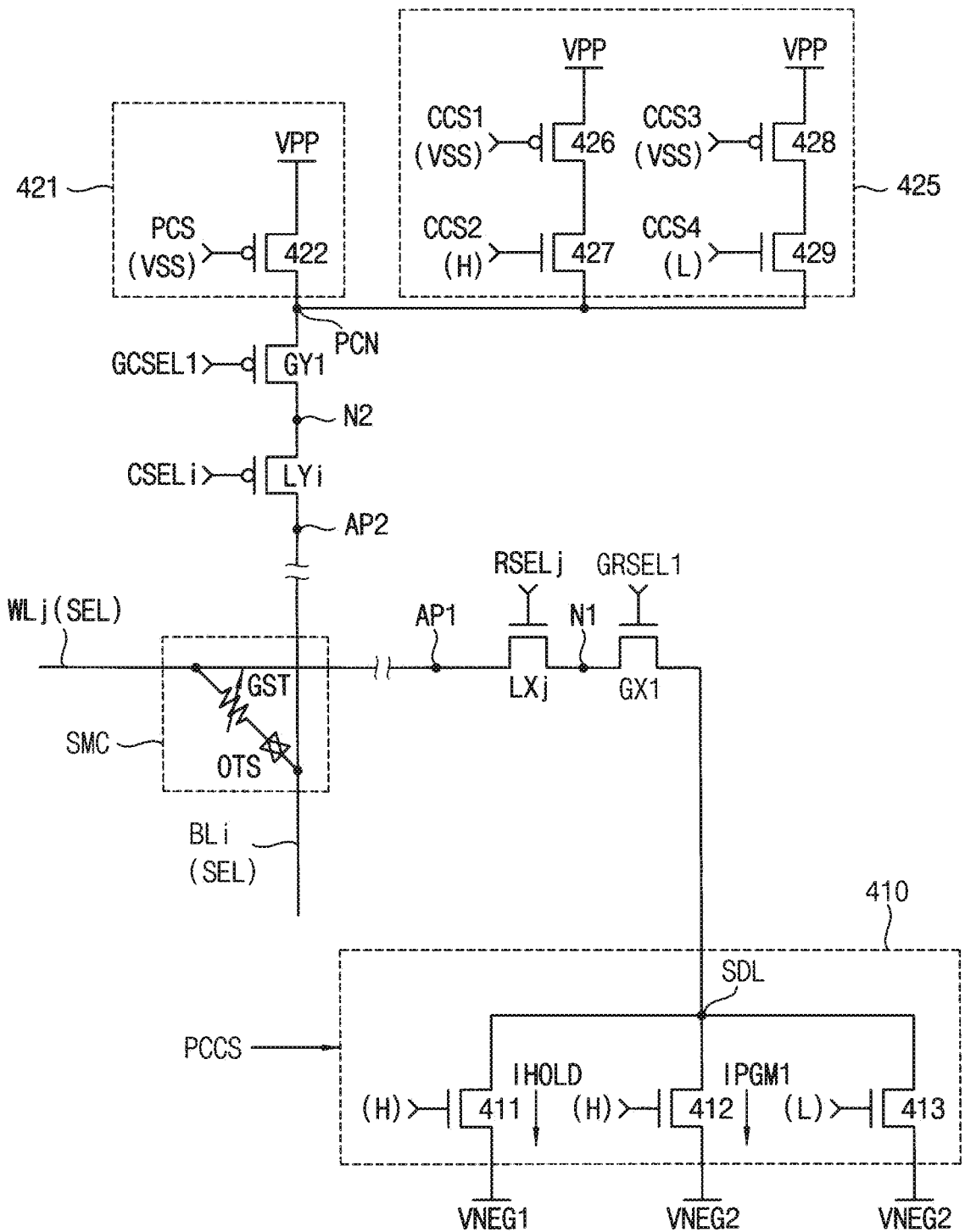
FIGS. 12 through 13B illustrate that the control circuit adjust levels of selection signals (voltages) applied to the row selection switch and the column selection switch according to a distance from the access point to the selected memory cell in the resistive memory device of FIG. 10, respectively.
Figure 14:
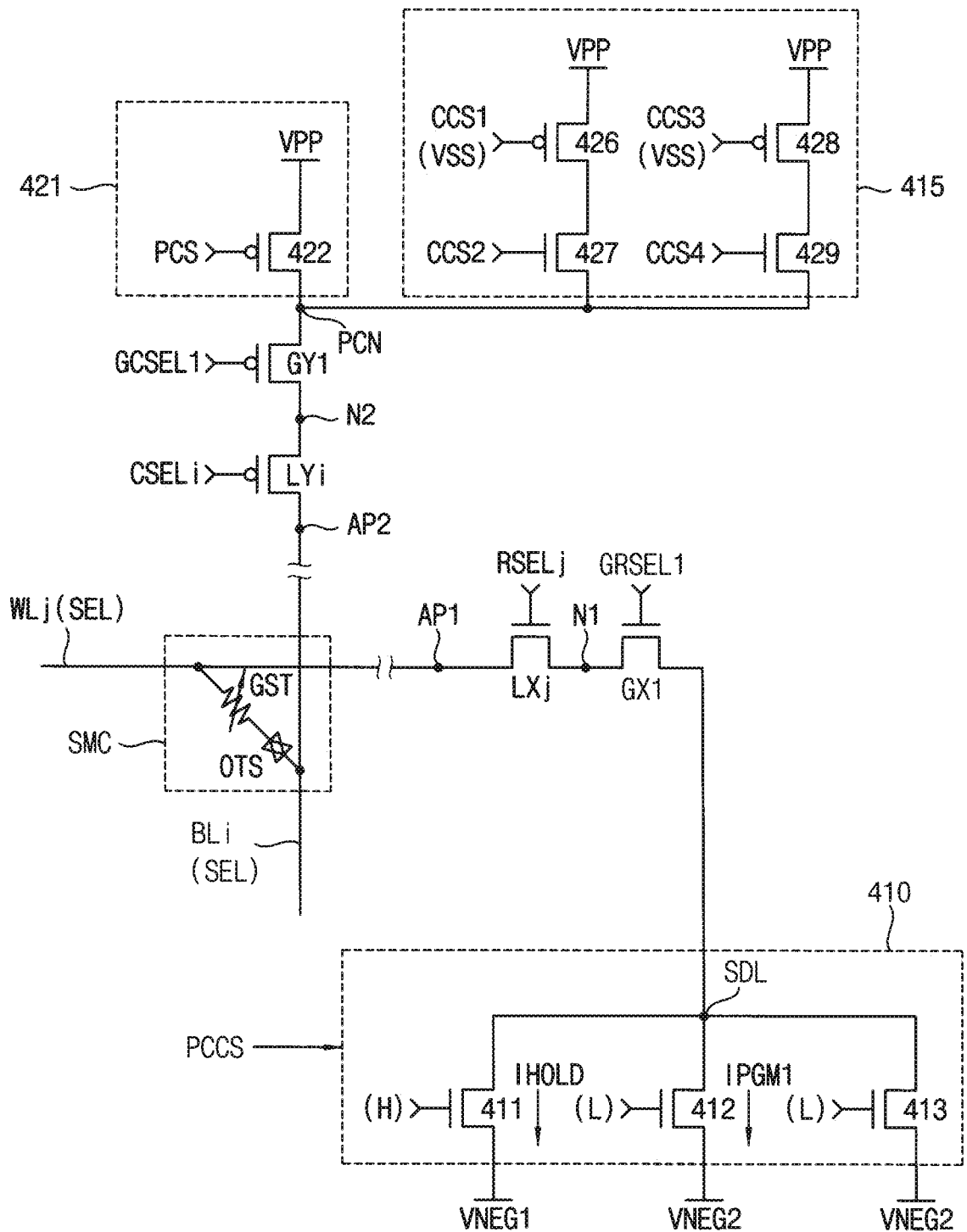
FIGS. 14, 15A and 15B illustrate that the control circuit 300 precharges the selected bit-line with multi-step according to the distance of the selected memory cell from the access point in the resistive memory device of FIG. 10.
Figure 16:
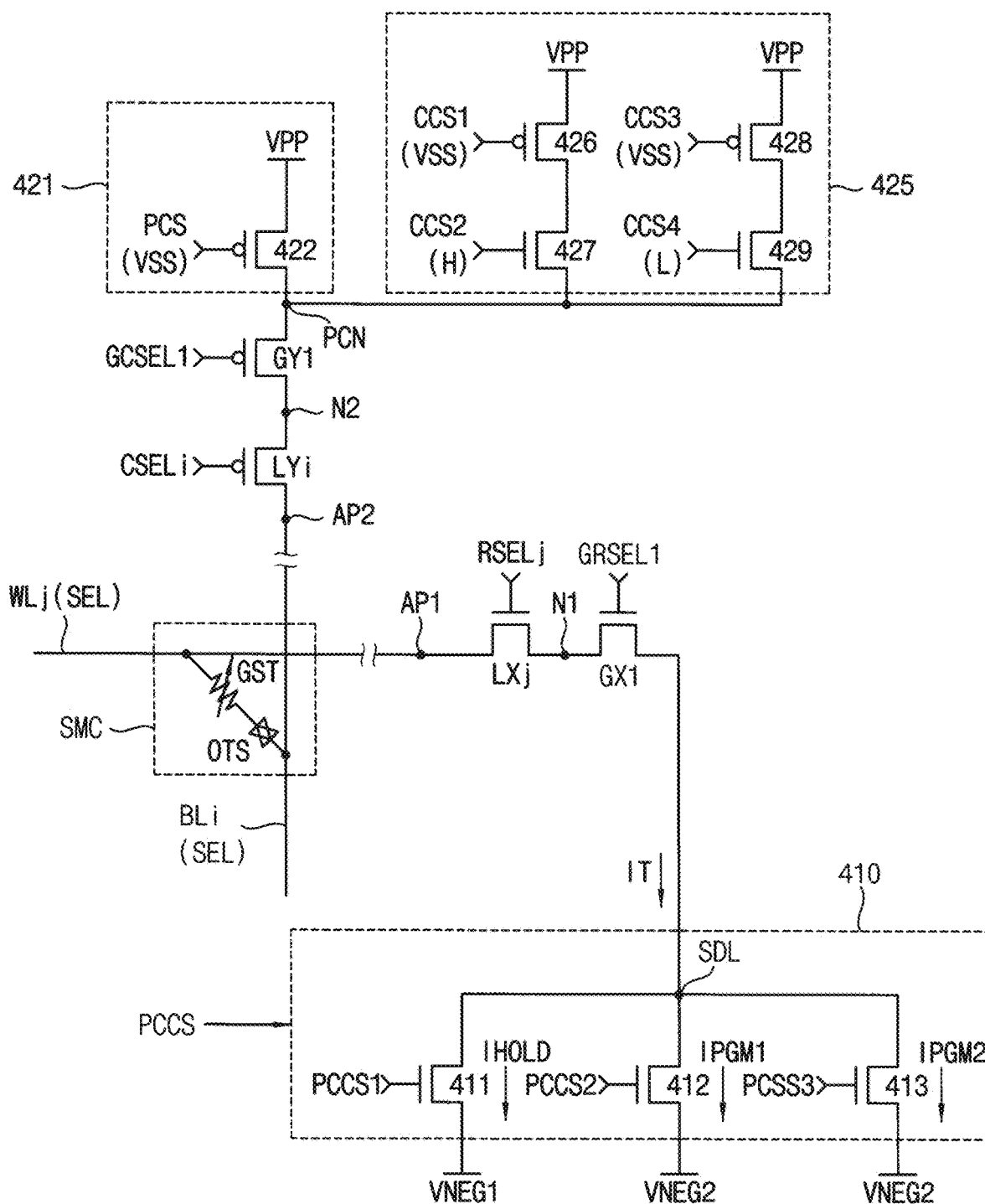
FIGS. 16, 17A and 17B illustrate that the control circuit applies the program current having multi-step to the selected memory cell according to the distance of the selected memory cell from the access point in the resistive memory device of FIG. 10.

FIGS. 12, 14, and 16 illustrate the resistive memory device of FIG. 10 in detail, respectively.

In FIGS. 12, 14, and 16, it is assumed that the read circuit 420 in FIG. 10 includes a precharge circuit 421 and a clamping circuit 425. Additionally, the write driver 410 in FIG. 10 includes NMOS transistors 411, 412 and 413 connected/coupled in parallel between a data sensing node SDL and negative voltages VNEG1 and VNEG2. Each of the NMOS transistors 411, 412, and 413 may correspond to a current source. Program current control signals PCCS are applied to gates of the NMOS transistors 411, 412 and 413.

Referring to FIGS. 12, 14 and 16, the precharge circuit 421 includes a first PMOS transistor 422 connected/coupled between a power supply voltage VPP and a precharge node PCN. A gate of the first PMOS transistor 422 receives a precharge control signal PCS.

The clamping circuit 425 is connected/coupled to the precharge node PCN in parallel with the precharge circuit 421 and includes a second PMOS transistor 426, a first NMOS transistor 427, a third PMOS transistor 428, and a second NMOS transistor 429.

The second PMOS transistor 426 and the first NMOS transistor 427 are connected/coupled in series between the power supply voltage VPP and the precharge node PCN, and the third PMOS transistor 428 and the second NMOS transistor 429 are connected/coupled in series between the power supply voltage VPP and the precharge node PCN. The second PMOS transistor 426 and the first NMOS transistor 427 are connected/coupled in parallel with the third PMOS transistor 428 and the second NMOS transistor 429. Gates of the second PMOS transistor 426, the first NMOS transistor 427, the third PMOS transistor 428 and the second NMOS transistor 429 receive clamping control signals CCS1, CCS2, CCS3 and CCS4, respectively.

The precharge control signal PCS and the clamping control signals CCS1, CCS2, CCS3, and CCS4 may be included in the control signal CTL31.

A selected word-line WLj (SEL) coupled to the selected memory cell SMC is connected/coupled to the write driver 410 through a row selection switch LXj and the global selection switch GX1 which are turned on a row selection signal RSELj and the global selection signal GRSEL1, respectively, and a selected bit-line BLi (SEL) connected/coupled to the selected memory cell SMC is connected/coupled to the precharge circuit 421 and the clamping circuit 425 through a column selection switch LYi and the global selection switch GY1 which are turned on a column selection signal CSELi and the global selection signal GCSEL1, respectively.

Figure 13A:
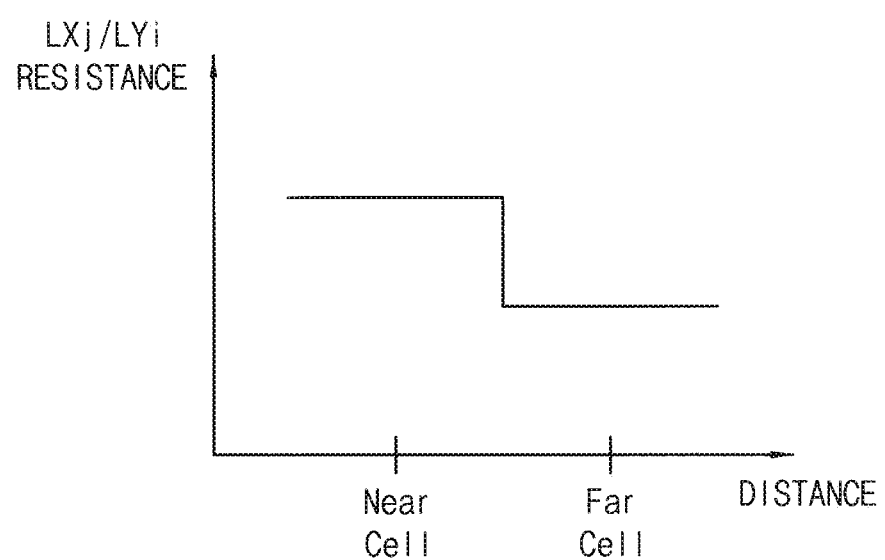
Figure 13B:
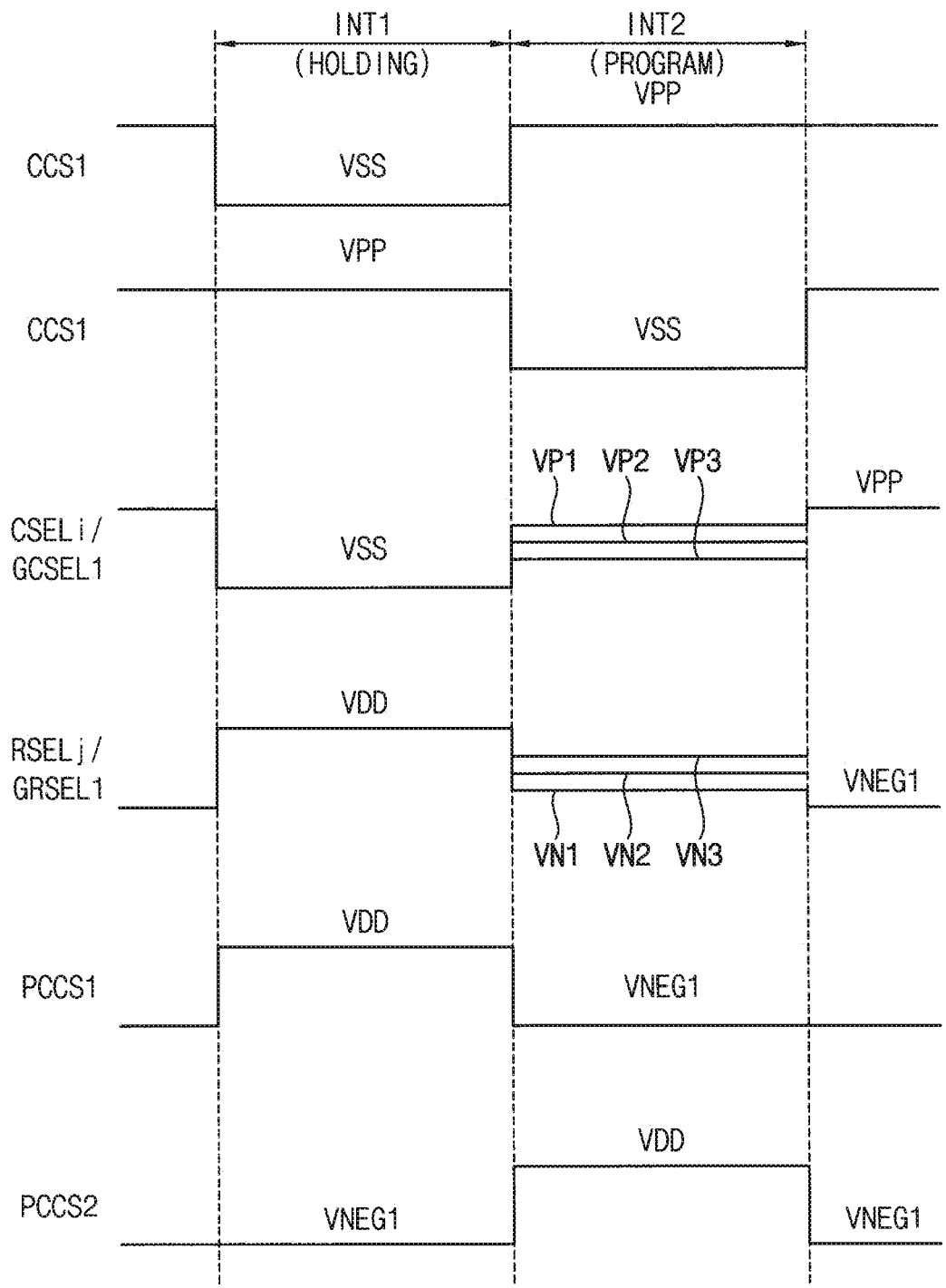

FIGS. 12 through 13B illustrate that the control circuit adjust levels of selection signals, e.g. of voltages, applied to the row selection switch and the column selection switch according to a distance from the access point to the selected memory cell in the resistive memory device of FIG. 10, respectively.

Referring to FIGS. 12 and 13A, the memory device 500 controls the row decoder 220 and the column decoder 230 to adjust levels of the row selection signal RSELj and the column selection signal CSELi according to the distance from the access points AP1 and AP2 to the selected memory cell SMC such that the resistance value which the selected memory cell SMC experiences varies according to the distance from the access points AP1 and AP2 to the selected memory cell SMC.

If the selected memory cell SMC is a near cell, which is relatively near to either or both of the access points AP1 and AP2, the memory device 500 may adjust the voltage levels of the row selection signal RSELj and the column selection signal CSELi such that resistance values of the row selection signal RSELj and the column selection signal CSELi are increased.

If the selected memory cell SMC is a far cell, which is relatively far from either or both of the access points AP1 and AP2, the memory device 500 may adjust the voltage levels of the row selection signal RSELj and the column selection signal CSELi such that resistance values of the row selection signal RSELj and the column selection signal CSELi are decreased.

In FIG. 12, the gate of the first PMOS transistor 422 receives the precharge control signal PCS with a ground voltage VSS, the gate of the second PMOS transistor 426 receives the clamping control signal CCS1 with the ground voltage VSS, and the gate of the third PMOS transistor 428 receives the clamping control signal CCS3 with the ground voltage VSS. The gate of the first NMOS transistor 427 receives the clamping control signal CCS2 with a high level (H) and the gate of the second NMOS transistor 429 receives the clamping control signal CCS4 with a low level (L). In addition, gates of the NMOS transistors 411 and 412 receive the program current control signal PCCS with a high level (H) and the gate of the NMOS transistor 413 receives the program current control signal PCCS with a low level (L), and thus, stand-by current IHOLD and a program current IPGM1 are applied to the selected memory cell SMC through the selected word-line WLj.

Referring to FIGS. 12 and 13B, during a first interval INT1 corresponding a stand-by interval, the column selection signal CSELi and the global selection signal GCSEL1 with the ground voltage VSS are applied to the column selection switch LYi and the global selection switch GY1, respectively, the row selection signal RSELj and the global selection signal GRSEL1 with the power supply voltage VDD are applied to the row selection switch LXj and the global selection switch GX1, respectively, a first program control signal PCCS1 having the power supply voltage VDD is applied to the gate of the NMOS transistor 411, and a second program control signal PCCS2 having the first negative voltage VNEG1 is applied to the gate of the NMOS transistor 412. Therefore, a program current is not applied to the selected memory cell SMC.

During a second interval INT2 corresponding a program interval, the column selection signal CSELi and the global selection signal GCSEL1 with different levels VP1, VP2 and VP3 according to the distance from the second access point AP2 are applied to the column selection switch LYi and the global selection switch GY1, respectively, the row selection signal RSELj and the global selection signal GRSEL1 with different levels VN1, VN2 and VN3 according to the distance from the first access point AP1 are applied to the row selection switch LXj and the global selection switch GX1, respectively, the first program control signal PCCS1 having the first negative voltage VNEG1 is applied to the gate of the NMOS transistor 411, and the second program control signal PCCS2 having the power supply voltage VDD is applied to the gate of the NMOS transistor 412. Therefore, the program current IPGM1 is applied to the selected memory cell SMC.

Here, the level VP1 is greater than the level VP2, the level VP2 is greater than the level VP3, and the level VP3 is equal to or greater than the ground voltage VSS. In addition, the level VN3 is greater than the level VN2, the level VN2 is greater than the level VN1, and the level VN3 is equal to or less than the power supply voltage VDD. The levels VP1 and VN1 may be employed if the selected memory cell SMC is a near cell, the levels VP3 and VN3 may be employed if the selected memory cell SMC is a far cell, and the levels VP2 and VN2 may be employed if the selected memory cell SMC is a middle cell between the near cell and the far cell. A far cell may correspond to a cell having a distance greater than or equal to an upper distance threshold, a near cell may correspond to a cell having a distance less than a lower distance threshold, and a middle cell may correspond to a cell having a distance between the lower distance threshold and the upper distance threshold.

When the program operation is completed, the column selection signal CSELi and the global selection signal GCSEL1 with the power supply voltage VPP are applied to the column selection switch LYi and the global selection switch GY1, respectively, the row selection signal RSELj and the global selection signal GRSEL1 with the first negative voltage VNEG1 are applied to the row selection switch LXj and the global selection switch GX1, respectively, and the second program control signal PCCS2 having the first negative voltage VNEG1 is applied to the gate of the NMOS transistor 412.

Figure 15A:
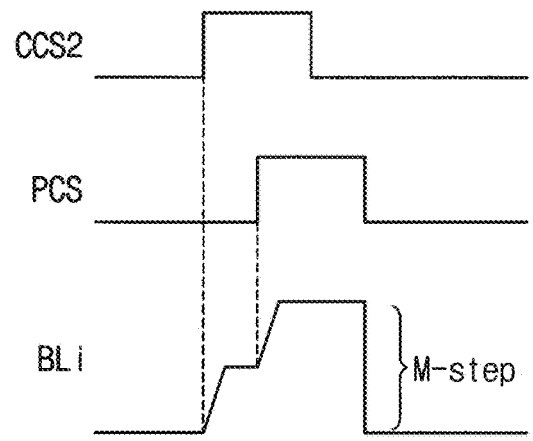
Figure 15B:
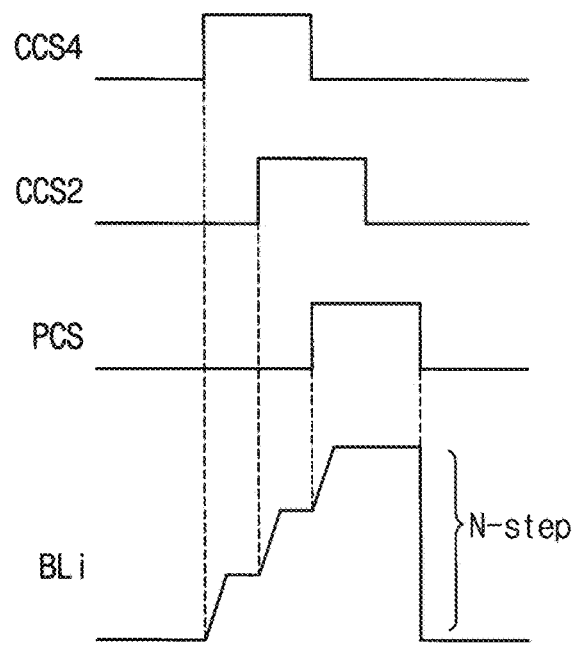

FIGS. 14, 15A and 15B illustrate that the control circuit 300 precharges the selected bit-line with multi-steps according to the distance of the selected memory cell from either or both of the access points in the resistive memory device of FIG. 10.

Referring to FIGS. 14 and 15A, if the selected memory cell SMC is a far cell, which is relatively far from the access points, the control circuit 300 controls the precharge circuit 421 and the clamping circuit 425 in the read circuit 420 to precharge the selected bit-line BLi by increasing a voltage level of the selected bit-line BLi with M-steps (M is a natural number greater than one). In this case, the gate of the second PMOS transistor 426 receives the clamping control signal CCS1 with the ground voltage VSS and the gate of the third PMOS transistor 428 receives the clamping control signal CCS3 with the ground voltage VSS. The gate of the second NMOS transistor 429 receives the clamping control signal CCS4 with a high level (H).

The control circuit 300 precharge the selected bit-line BLi with M-steps by activating the clamping control signal CCS4 with a high level before activating the precharge control signal PCS and by partially overlapping activation intervals of the clamping control signal CCS4 and the precharge control signal PCS.

Referring to FIGS. 14 and 15B, if the selected memory cell SMC is a near cell, which is relatively near to the access point, the control circuit 300 controls the precharge circuit 421 and the clamping circuit 425 in the read circuit 420 to precharge the selected bit-line BLi by increasing a voltage level of the selected bit-line BLi with N-steps (N is a natural number greater than one and greater than M). In this case, the gates of the second PMOS transistor 426 and the third PMOS transistor 428 receive the clamping control signals CCS1 and CCS3 with the ground voltage VSS.

The control circuit 300 precharge the selected bit-line BLi with N-steps by activating the clamping control signal CCS4 with a high level firstly, activating the clamping control signal CCS2 with a high level secondly, activating the precharge control signal PCS thirdly, partially overlapping activation intervals of the clamping control signals CCS4 and CCS2 and partially overlapping activation intervals of the clamping control signal CCS2 and the precharge control signal PCS.

In some example embodiments, the control circuit 300 may precharge the selected bit-line BLi with N-steps if the selected memory cell SNC is either a near cell or a far cell.

Figure 17A:
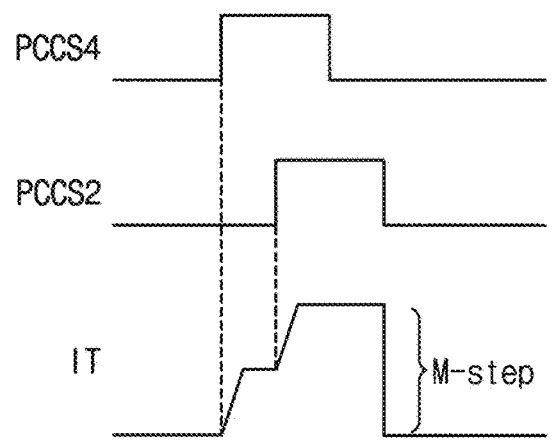
Figure 17B:
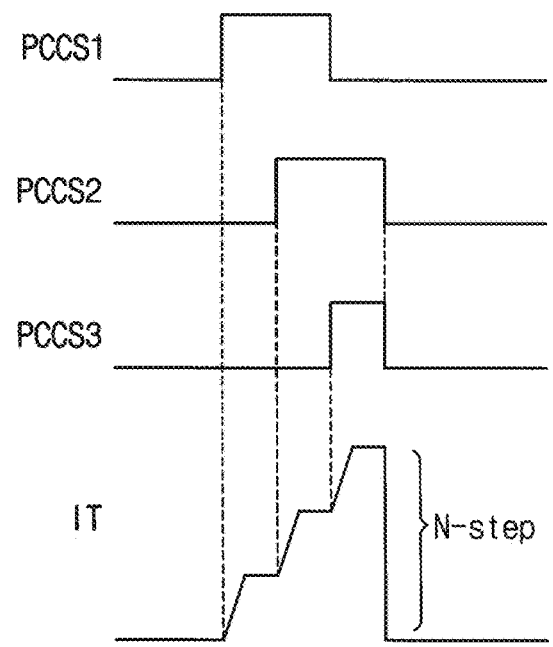

FIGS. 16, 17A and 17B illustrate that the control circuit applies the program current having multi-step to the selected memory cell according to the distance of the selected memory cell from the access point in the resistive memory device of FIG. 10.

In FIG. 16, the gate of the first PMOS transistor 422 receives the precharge control signal PCS with the ground voltage VSS, the gate of the second PMOS transistor 426 receives the clamping control signal CCS1 with the ground voltage VSS and the gate of the third PMOS transistor 428 receives the clamping control signal CCS3 with the ground voltage VSS. The gate of the first NMOS transistor 427 receives the clamping control signal CCS2 with a high level (H) and the gate of the second NMOS transistor 429 receives the clamping control signal CCS4 with a low level (L).

Referring to FIGS. 16 and 17A, if the selected memory cell SMC is a far cell, which is relatively far from the access point, the control circuit 300 controls the write driver 410 to apply a program current having M-steps IT to the selected memory cell SMC through the selected bit-line WLj. In this case, the gates of the second NMOS transistors 411 and 412 receives the program current control signals PCCS1 and PCCS2 which have activation intervals partially overlapped and the gate of the NMOS transistor 413 receives the program current control signal PCCS3 with a low level, and the program current IT corresponding to sum of the stand-by current IOHLD and the first program current IPGM1 is applied to the selected memory cell SMC through the selected bit-line WLj.

Referring to FIGS. 16 and 17B, if the selected memory cell SMC is a near cell, which is relatively near to the access point, the control circuit 300 controls the write driver 410 to apply a program current having N-steps IT to the selected memory cell SMC through the selected bit-line WLj. In this case, the gates of the second NMOS transistors 411, 412 and 413 receives the program current control signals PCCS1, PCCS2 and PCCS3 which have activation intervals partially overlapped, and the program current IT corresponding to sum of the stand-by current IOHLD, the first program current IPGM1 and the second program current IPGM3 is applied to the selected memory cell SMC through the selected bit-line WLj.

In some example embodiments, the control circuit 300 may apply the program current having N-steps to the selected memory cell SMC if the selected memory cell SNC is either a near cell or a far cell.

Figure 18:
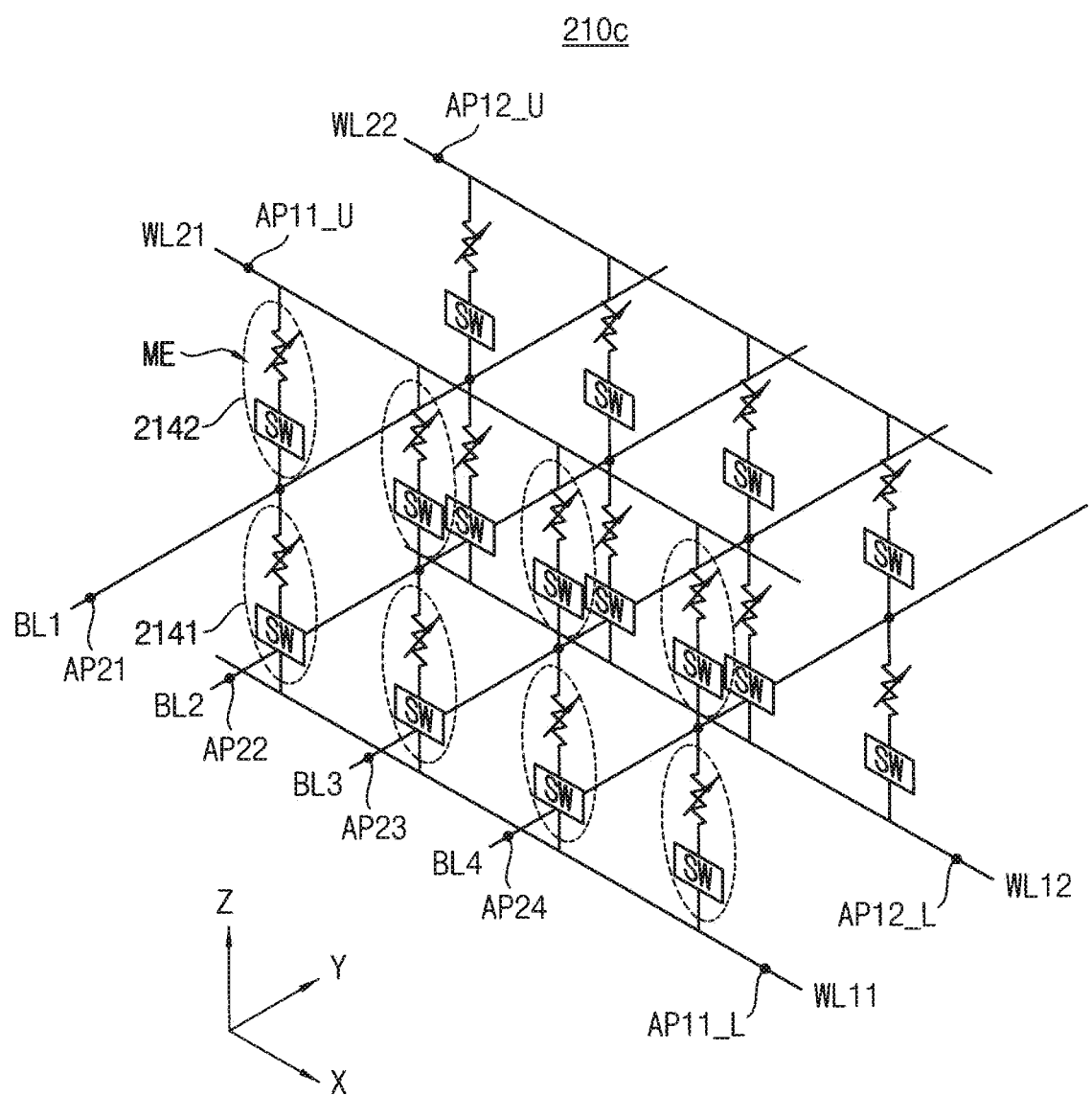
FIG. 18 is an equivalent circuit diagram illustrating an example of the memory cell array according to some example embodiments of inventive concepts.

FIG. 18 is an equivalent circuit diagram illustrating an example of the memory cell array according to some example embodiments of inventive concepts.

Referring to FIG. 18, a memory cell array 210c includes lower word-lines WL11 and WL12, which extend in a first direction X and are spaced apart from each other in a second direction Y perpendicular to the first direction X, and upper word-lines WL21 and WL22, which extend in the first direction X and are spaced apart from each other in the second direction Y. The upper word-lines WL21 and WL22 are spaced apart from the lower word-lines WL11 and WL12 in a third direction Z perpendicular to the first and second directions X and Y. In addition, the memory cell array 210c includes common bit-lines BL1, BL2, BL3, and BL4, which are spaced apart from each other in the first direction X and spaced apart from the upper word-lines WL21 and WL22 and the lower word-lines WL11 and WL12 in the third direction Z, and extend in the second direction Y.

First and second memory cells 2141 and 2142 are disposed, respectively, between the common bit-lines BL1, BL2, BL3, and BL4 and the lower word-lines WL11 and WL12, and between the common bit-lines BL1, BL2, BL3, and BL4 and the upper word-lines WL21 and WL22. Second access points AP21, AP22, AP23 and AP24 are marked in the common bit-lines BL1, BL2, BL3, and BL4, first sub access points AP11_L and AP12_L are marked in the lower word-lines WL11 and WL12 and the second sub access points AP11_U and AP12_U are marked in the upper word-lines WL21 and WL22 For example, the first memory cells 2141 may be arranged at respective intersections of the common bit-lines BL1, BL2, BL3, and BL4 and the lower word-lines WL11 and WL12, and each of the first memory cells 2141 may include a variable resistance pattern ME for storing data and a selection device SW for selecting the variable resistance pattern ME. The second memory cells 2142 may be arranged at respective intersections of the common bit-lines BL1, BL2, BL3, and BL4 and the upper word-lines WL21 and WL22, and each of the second memory cells MC2 may also include the variable resistance pattern ME for storing data and the selection device SW for selecting the variable resistance pattern ME.

The first and second memory cells 2141 and 2142 may have substantially the same structure and may be arranged in the third direction Z. For example, in the first memory cell MC1 arranged between the lower word-line WL11 and the common bit-line BL1, the selection device SW may be electrically connected to the lower word-line WL11, the variable resistance pattern ME may be electrically connected, e.g. directly electrically connected or coupled, to the common bit-line BL1, and the variable resistance pattern ME and the selection device SW may be similarly connected in series to each other. Similarly, in the second memory cell MC2 arranged between the upper word-line WL21 and the common bit-line BL1, the variable resistance pattern ME may be electrically connected, e.g. directly electrically connected or coupled, to the upper word-line WL21, the selection device SW may be similarly electrically connected to the common bit-line BL1, and the variable resistance pattern ME and the selection device SW may be connected in series to each other.

When the memory cell array 210 includes the memory cell array 210c of FIG. 18, the control circuit 300 may adjust the resistance value which the selected memory cell experiences based on at least one of a distance of the selected memory cell from a second access point, a distance of the selected memory cell from a first sub access point and a distance of the selected memory cell from a second sub access point.

Figure 19:
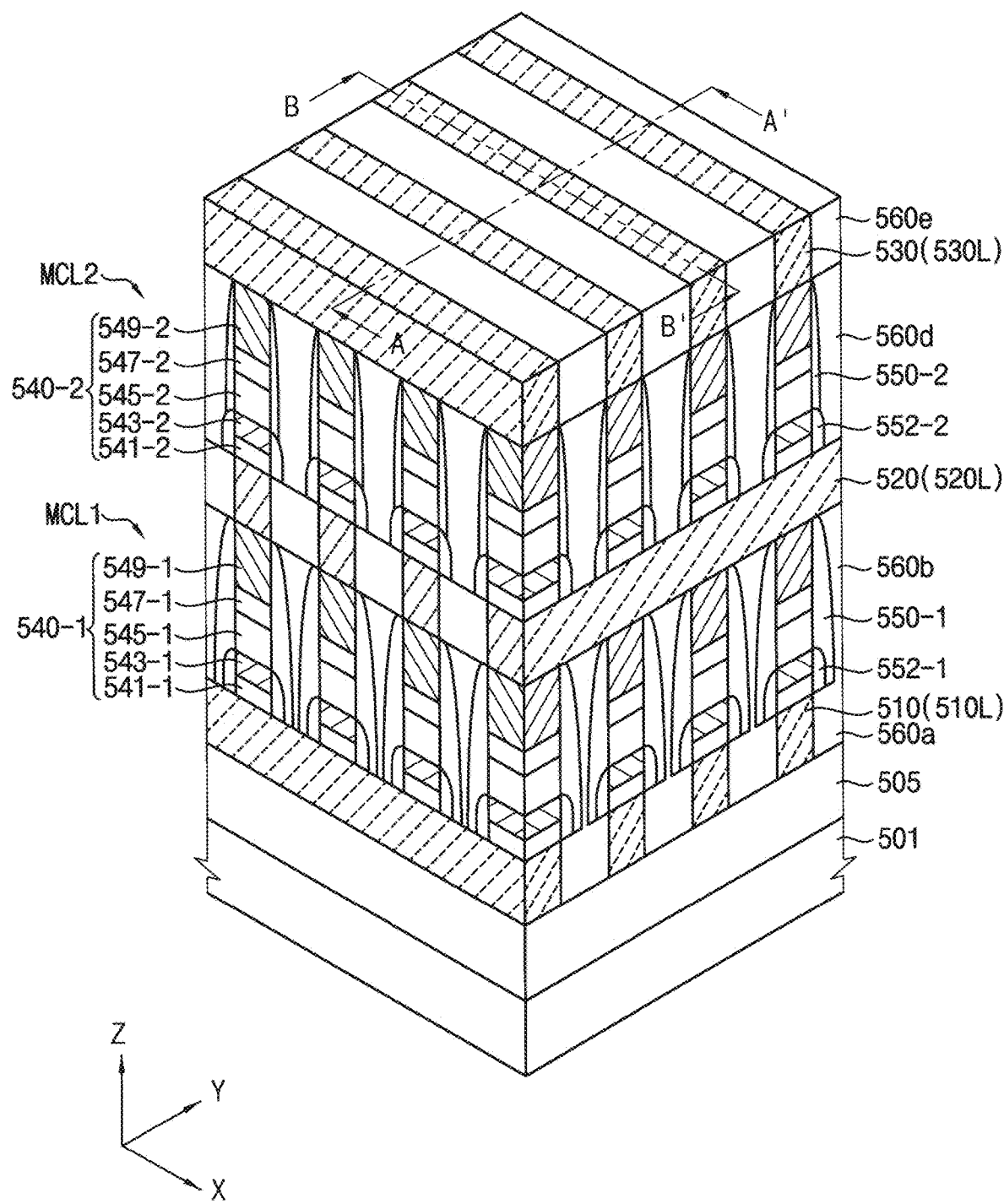
FIG. 19 is a perspective view of a memory device according to some example embodiments.
Figure 20:
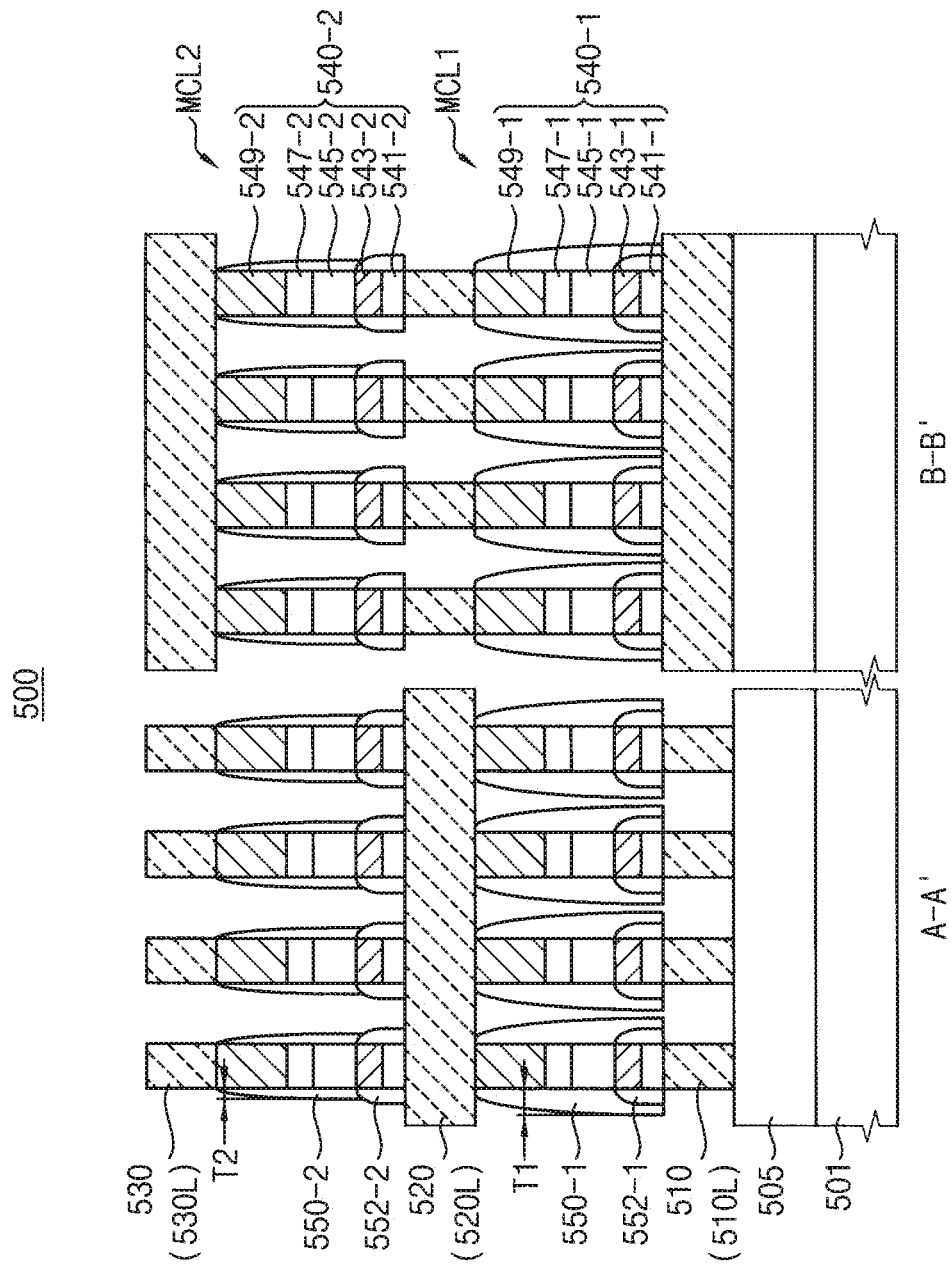
FIG. 20 is a sectional view taken along lines II-II, and of FIG. 19.

FIG. 19 is a perspective view of a memory device according to some example embodiments and FIG. 20 is a sectional view taken along lines II-II, and III-III' of FIG. 19.

To reduce complexity in the drawings and to provide a better understanding of inventive concepts, insulating layers 560a, 560b, 560c, 560d, and 560e are omitted from FIG. 20.

Referring to FIGS. 19 and 20, a memory device 500 includes a substrate 501, a first electrode line layer 510L, a second electrode line layer 520L, a third electrode line layer 530L, a first memory cell layer MCL1, a second memory cell layer MCL2, first spacers 550-1, and second spacers 550-2.

As shown in FIGS. 19 and 20, an interlayered insulating layer 505 is arranged on the substrate 501. The interlayered insulating layer 505 may be formed of an oxide material (e.g., silicon oxide) and/or a nitride material (e.g., silicon nitride), and may be used to electrically separate the first electrode line layer 510L from the substrate 501. Although, in the memory device 500 according to example embodiments, the interlayered insulating layer 505 is arranged on the substrate 501, this is just an example, and inventive concepts are not limited thereto. For example, in the memory device 500 according to some example embodiments, an integrated circuit layer may be arranged on the substrate 501, and memory cells may be arranged on the integrated circuit layer. The integrated circuit layer may include, for example, a peripheral circuit for operation of the memory cells and/or a core circuit for calculations. Here, the structure, in which an integrated circuit layer including a peripheral circuit and/or a core circuit is arranged on a substrate and memory cells are arranged on the integrated circuit layer, may be referred to as a 'cell-on-peripheral (COP) structure'.

The first electrode line layer 510L may include a plurality of first electrode lines 510, which extend in the first direction X and are arranged in parallel to each other and spaced apart from each other in the second direction Y. The second electrode line layer 520L may include a plurality of second electrode lines 520, which extend in the second direction Y and are arranged in parallel to each other and spaced apart from each other in the first direction X. In addition, the third electrode line layer 530L may include a plurality of third electrode lines 530, which extend in the first direction X and are arranged in parallel to each other and spaced apart from each other in the second direction Y.

In operational aspects of a memory device, the first and third electrode lines 510 and 530 may serve as word-lines, and the second electrode lines 520 may serve as bit-lines. When the first and third electrode lines 510 and 530 serve as the word-lines, the first electrode lines 510 may serve as lower word-lines and the third electrode lines 530 may serve as upper word-lines. In addition, the second electrode lines 520 may be shared by the lower word-lines and the upper word-lines. For example, the second electrode lines 520 may serve as common bit-lines. Each of the first electrode lines 510, the second electrode lines 520, and the third electrode lines 530 may include, for example, metals, conductive metal nitrides, conductive metal oxides, or combinations thereof. The first electrode lines 510, the second electrode lines 520, and the third electrode lines 530 may be formed of the same, or alternatively of different, metals. A thickness of the first electrode lines 510, a thickness of the second electrode lines 520, and a thickness of the third electrode lines may be the same, or may be different, from one another. A sheet resistance and/or a resistivity of each of the first electrode lines 510, the second electrode lines 520, and the third electrode lines 530 may be the same as, or alternatively may be different from, one another.

The first memory cell layer MCL1 includes a plurality of first memory cells 540-1, which are spaced apart from each other in the first and second directions X and Y and serve as the first memory cells 2141 of FIG. 18. The second memory cell layer MCL2 includes a plurality of second memory cells 540-2, which are spaced apart from each other in the first and second directions X and Y and serve as the second memory cells 2142 of FIG. 18. As shown in FIG. 19, the first electrode lines 510 and the second electrode lines 520 intersect each other, and the second electrode lines 520 and the third electrode lines 530 intersect each other. The first memory cells 540-1 are disposed between the first electrode line layer 510L and the second electrode line layer 520L and at respective intersections of the first electrode lines 510 and the second electrode lines 520, and are connected to the first electrode lines 510 and the second electrode lines 520. The second memory cells 540-2 are disposed between the second and third electrode line layers 520L and 530L and at respective intersections of the second and third electrode lines 520 and 530, and are connected to the second and third electrode lines 520 and 530.

In some example embodiments, each of the first and second memory cells 540-1 and 540-2 has a pillar-shaped structure with a rectangular section. Each of the first memory cells 540-1 and each of the second memory cells 540-2 include, respectively, a lower electrode 541-1 and a lower electrode 541-2, a selection device 543-1 and a selection device 543-2, an intermediate electrode 545-1 and an intermediate electrode 545-2, a heating electrode 547-1 and a heating electrode 547-2, and a variable resistance pattern 549-1 and a variable resistance pattern 549-2. Since the first and second memory cells 540-1 and 540-2 have substantially the same structure, the following description will be given with reference to the first memory cells 540-1, for convenience of discussion.

The first spacers 550-1 are provided to enclose side surfaces of the first memory cells 540-1. The second spacers 550-2 are provided to enclose side surfaces of the second memory cells 540-2. Since the first and second spacers 550-1 and 550-2 are provided to enclose the side surfaces of the first and second memory cells 540-1 and 540-2, the first and second spacers 550-1 and 550-2 may be used to protect the first and second memory cells 540-1 and 540-2 (in particular, the variable resistance patterns 549-1 and 549-2 and/or the selection devices 543-1 and 543-2).

In the memory device 500, the first spacer 550-1 has a first thickness T1, and the second spacer 550-2 has a second thickness T2. In some example embodiments, the first thickness T1 and greater than the second thickness T2. In the memory device 500, by forming thick first spacers 550-1 of the first memory cells 540-1 and forming thinner second spacers 550-2 of the second memory cells 540-2, resistance characteristics of the first and second memory cells 540-1 and 540-2 may be modified, e.g. may be enhanced.

The memory device 500 further includes a first inner spacer 552-1 and a second inner spacer 552-2. The first inner spacer 552-1 is provided to cover the lower electrode 541-1 and the selection device 543-1 of the first memory cell 540-1, and the second inner spacer 552-2 is provided to cover the lower electrode 541-2 and the selection device 543-2 of the second memory cell 540-2. The first and second inner spacers 552-1 and 552-2 may be formed, using a process separate from that used to form the first and second spacers 550-1 and 550-2, for more effective protection of the selection devices 543-1 and 543-2. However, in some example embodiments of inventive concepts, the first and second inner spacers 552-1 and 552-2 are omitted.

As shown in FIG. 19, a first insulating layer 560a is arranged between the first electrode lines 510, and a second insulating layer 560b is arranged between the first memory cells 540-1 of the first memory cell layer MCL1. In addition, a third insulating layer 560c is arranged between the second electrode lines 520, a fourth insulating layer 560d is arranged between the second memory cells 540-2 of the second memory cell layer MCL2, and a fifth insulating layer 560e is arranged between the third electrode lines 530.

Figure 21A:
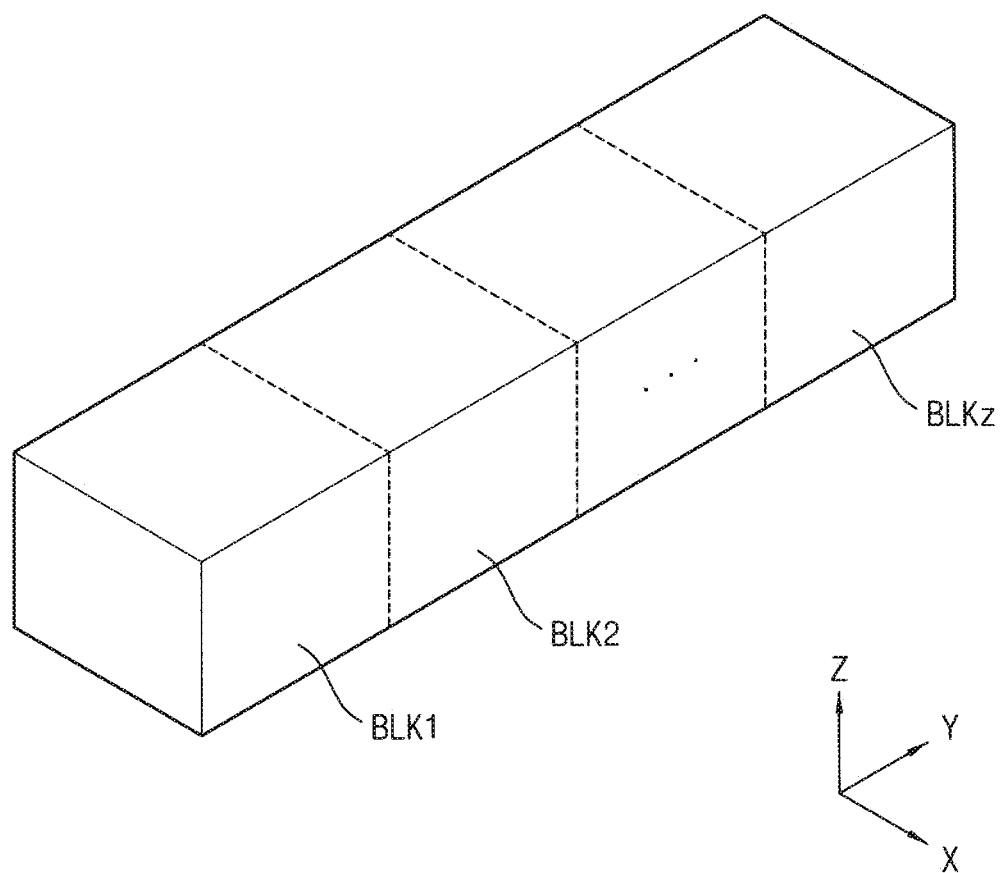
FIG. 21A is a block diagram and FIG. 21B is a circuit diagram showing an example of the memory cell array shown in FIG. 3.
Figure 21B:
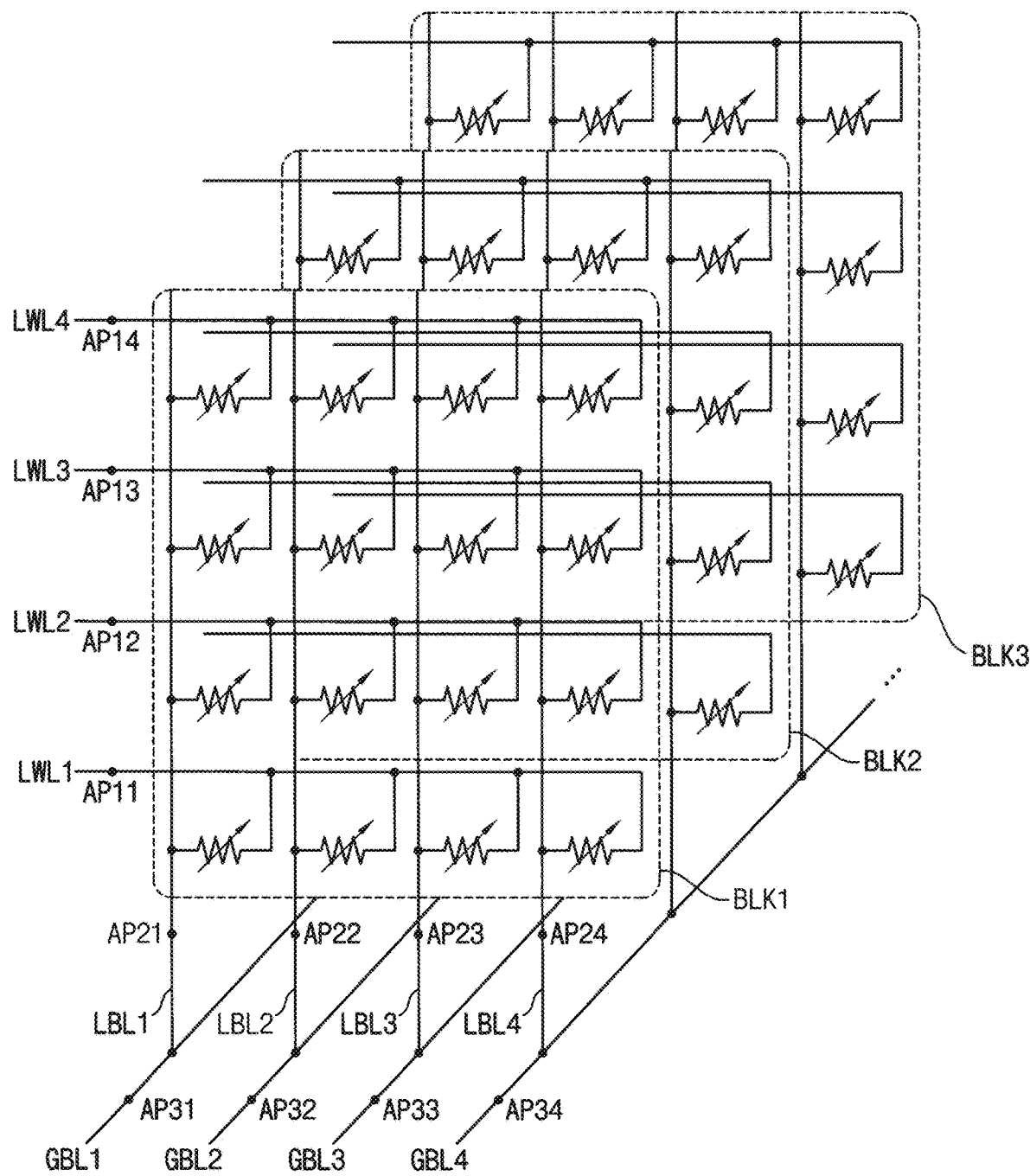

FIG. 21A is a block diagram and FIG. 21B is a circuit diagram showing an example of the memory cell array shown in FIG. 3.

Referring to FIGS. 21A and 21B, a memory cell array 210d includes multiple memory blocks BLK1 through BLKz. Each of the memory blocks BLK1 through BLKz has a three-dimensional, or a vertical, structure. In addition, each memory block includes multiple memory layers extending in a direction that is perpendicular to a substrate. Cell strings of one memory block are connected to multiple bit lines, multiple string selection lines, and multiple word lines. The cell strings of the memory blocks BLK1 through BLKz may share multiple bit lines BL.

The memory blocks BLK1 through BLKz may be selected by the row decoder 220 and/or the column decoder 230 shown in FIG. 3. For example, the row decoder 220 may be configured to select, among the memory blocks BLK1 through BLKz, a memory block connected to a word-line that corresponds to the row address R_ADDR.

FIG. 21B illustrates an example in which the memory blocks BLK1 through BLKz of FIG. 21A are embodied. For convenience of description, FIG. 21B does not illustrate a selection device that may be embodied as a diode or a transistor, as discussed above.

Referring to FIG. 21B, the memory cell array 210d includes the memory blocks BLK1 through BLKz that are three-dimensionally stacked. Each of the memory blocks BLK1 through BLKz may include multiple memory layers. Also, the memory cell array 210d includes multiple local bit-lines LBL1 through LBL4 that extend parallel to a Z-axis direction, and multiple local word-lines LWL1 through LWL4 that extend parallel to a Y-axis direction that is perpendicular to the Z-axis direction. Also, the local bit-lines LBL1 through LBL4 are connected to global bit-lines GBL1 through GBL4. First access points AP11, AP22, AP13 and AP14 are marked in the local word-lines LWL1 through LWL4, second access points AP21, AP22, AP23 and AP24 are marked in the local bit-lines LBL1 through LBL4 and third access points AP31, AP32, AP33 and AP34 are marked in the global bit-lines GBL1 through GBL4.

Referring to the first memory block BLK1, memory cells of the memory cell array 210d are connected between the local word-lines LWL1 through LWL4 and the local bit-lines LBL1 through LBL4. A writing operation and/or a reading operation may be performed on the memory cells by a current (or a voltage) that is applied to the local word-lines LWL1 through LWL4 and/or the local bit-lines LBL1 through LBL.

The memory layers share the local bit-lines LBL1 through LBL4 and the local word-lines LWL1 through LWL4 with other adjacent memory layers.

When the memory cell array 210 employs the memory cell array 210d of FIG. 21B, the control circuit 300 may adjust the resistance value which the selected memory cell experiences further based on at least one of a distance of the selected memory cell from third access points AP31, AP32, AP33 and AP34.

Figure 22:
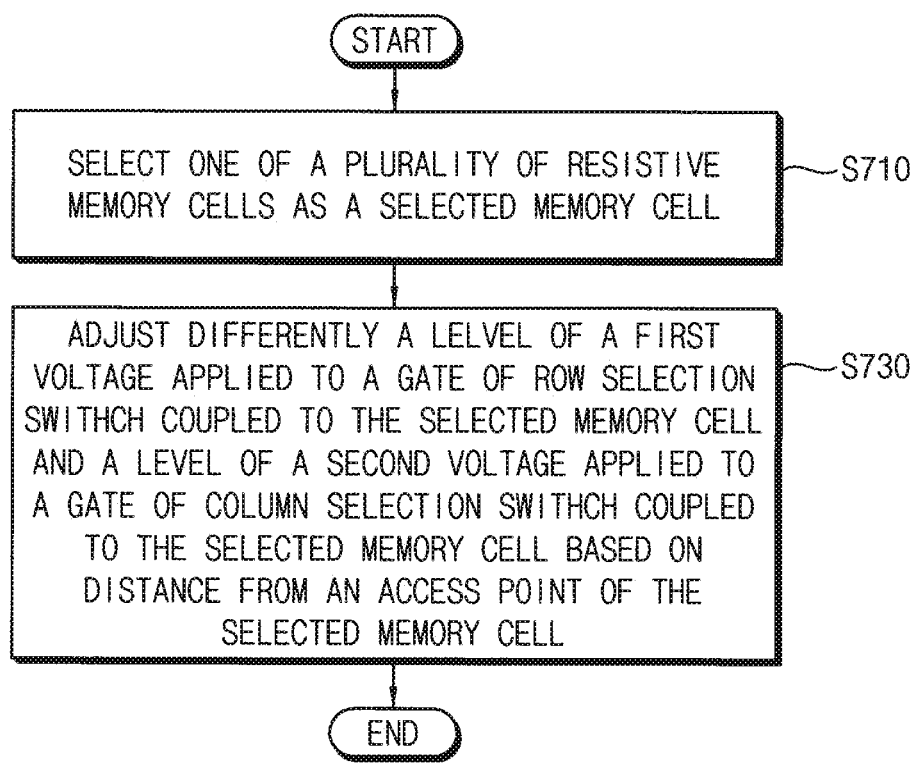
FIG. 22 is a flow chart illustrating a method of operating a memory device according to some example embodiments of inventive concepts.

FIG. 22 is a flow chart illustrating a method of operating a memory device according to some example embodiments of inventive concepts.

Referring to FIGS. 3 through 22, in a method of operating a resistive memory device 200 including a memory cell array 210 that includes a plurality of resistive memory cells connected/coupled to a plurality of word-lines and a plurality of bit-lines, the row decoder 220 and the column decoder 230 determines one of the resistive memory cells as a selected memory cell based on the address ADDR including the row address and the column address (S710).

The control circuit 300 applies a program current to the selected memory cell while adjusting a level of a first voltage applied to a gate of a row selection switch and a level of a second voltage applied to a gate of a column selection switch differently based on a distance from an access point to the selected memory cell in the memory cell array 210 during a program operation (S730). The row selection switch is connected/coupled to a word-line connected/coupled to the selected memory cell and the column selection switch is connected/coupled to a bit-line connected/coupled to the selected memory cell.

In some example embodiments, the control circuit 300 increases the level of the first voltage and decreases the level of the second voltage in proportion to the distance of the selected memory cell from the access point.

Figure 23:
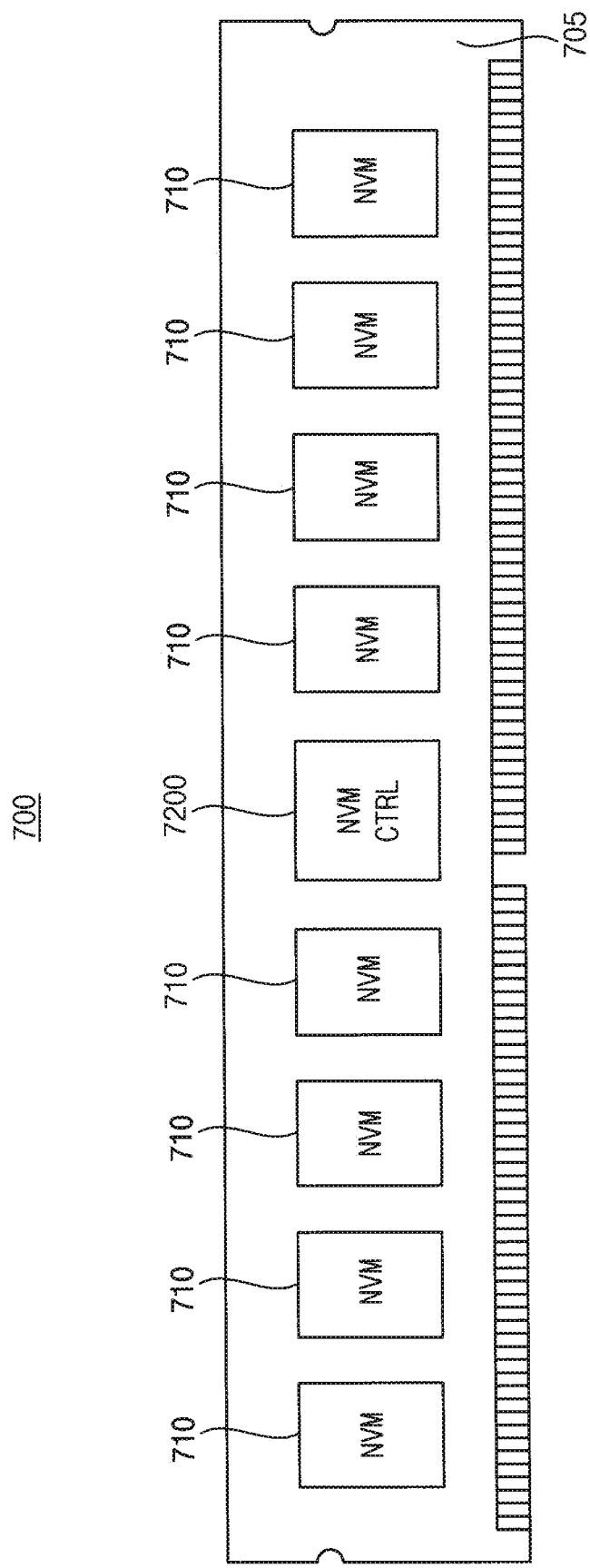
FIG. 23 is a diagram illustrating an example of a non-volatile memory module according to some example embodiments of inventive concepts.

FIG. 23 is a diagram illustrating an example of a nonvolatile memory module according to some example embodiments of inventive concepts.

Referring to FIG. 23, a nonvolatile memory module 700 may include a plurality of nonvolatile memory chips (NVM) 710, and a module controller (NVM CTRL) 720.

As illustrated in FIG. 23, the plurality of nonvolatile memory chips 710 may be disposed on a printed circuit board (PCB) 705, and the module controller 720 may be disposed in the middle of the plurality of nonvolatile memory chips 710 on the PCB 705. In some example embodiments, the plurality of nonvolatile memory chips 710 and the module controller 720 may be disposed on the PCB 705 according to a nonvolatile dual in-line memory module (NVDIMM) standard.

In some example embodiments, each of the plurality of nonvolatile memory chips 710 may employ the resistive memory device 200 of FIG. 3. Each of the nonvolatile memory chips 710 may include phase change memory cells. In some example embodiments, at least one of the plurality of nonvolatile memory chips 710 may include NAND flash memory device and the rest of the plurality of nonvolatile memory chips 710 may employ the resistive memory device 200 of FIG. 3.

The module controller 720 may receive a command signal, an address signal, and data from the memory controller 100, and may control operations of the plurality of nonvolatile memory chips 710 by providing the command signal, the address signal, and/or the data to at least one of the plurality of nonvolatile memory chips 710.

Figure 24:
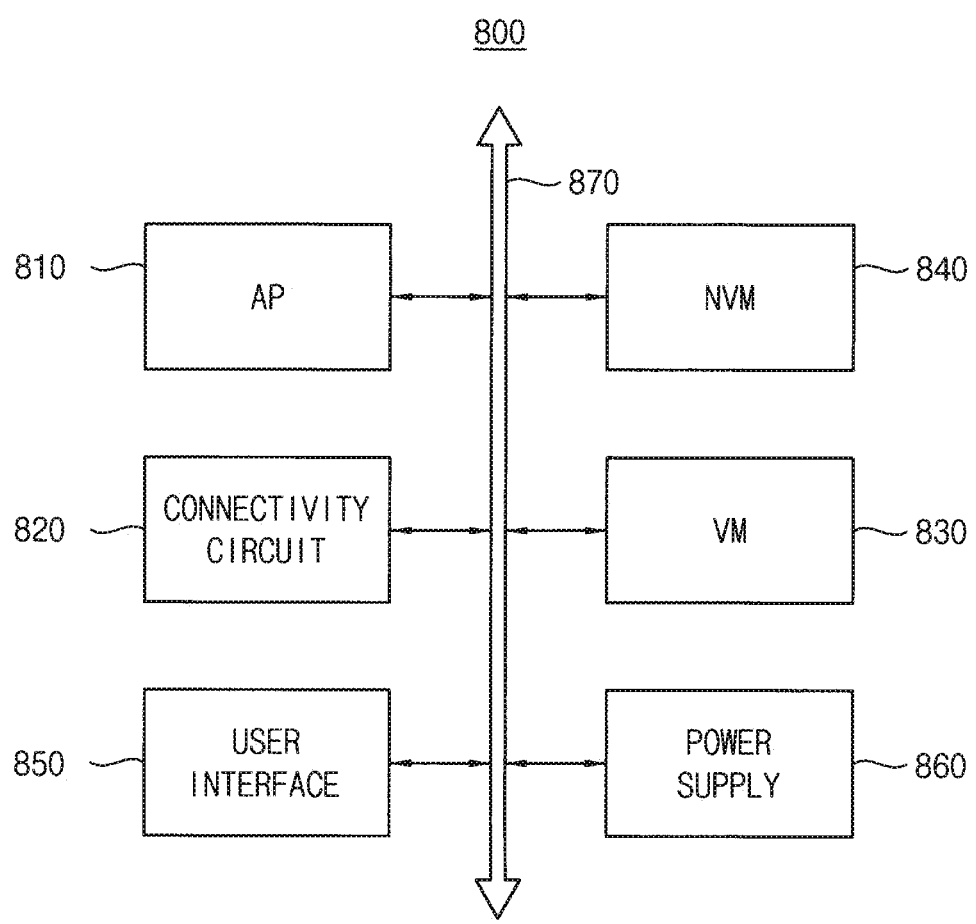
FIG. 24 is a block diagram illustrating a mobile system according to some example embodiments of inventive concepts.

FIG. 24 is a block diagram illustrating a mobile system according to some example embodiments of inventive concepts.

Referring to FIG. 24, a mobile system 800 includes an application processor (AP) 810, a connectivity circuit 820 a volatile memory device (VM) 830, a nonvolatile memory device (NVM) 840, a user interface 850, and a power supply 860 connected through a system bus 870. Any or all of the components of the mobile system 800, such as the AP 810, the connectivity circuit 820, the VM 830, the NVM 840, the user interface 850, or the power supply 860 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The application processor 810 may execute applications such as at least one of a web browser, a game application, a video player, etc. The connectivity circuit 820 may perform wired and/or wireless communication with an external device.

The volatile memory device 830 may store data processed by the application processor 3100, or may operate as a working memory. For example, the volatile memory device 830 may be or include a DRAM, such as at least one of a double data rate synchronous dynamic random access memory (DDR SDRAM), low power DDR (LPDDR) SDRAM, graphics DDR (GDDR) SDRAM, Rambus DRAM (RDRAM), etc.

The nonvolatile memory device 840 may store a boot image for booting the mobile system 800 and other data. The nonvolatile memory device 840 may be or include a phase change random access memory (PRAM) using a phase change materials, a resistance random access memory (RRAM) using a variable resistance material such as complex metal oxide, and/or a magneto-resistive random access memory (MRAM) using a magnetic material.

The user interface 850 may include at least one input device, such as a keypad, a touch screen, etc., and at least one output device, such as a speaker, a display device, etc. The power supply 860 may supply a power supply voltage to the mobile system 800.

The nonvolatile memory device 840 may increase performance and/or endurance by adjusting a resistance value which the selected memory cell experiences based on a distance of the selected memory cell from the access point as described with reference to FIGS. 1 through 22.

The example embodiments of inventive concepts may be applied to resistive memory devices and systems including the resistive memory devices.

The foregoing is illustrative of example embodiments. Although a few example embodiments have been described, those of ordinary skill in the art will readily appreciate that many modifications are possible in the example embodiments without materially departing from the present inventive concept. Accordingly, all such modifications are intended to be included within the scope of the present inventive concept.

What is claimed is:

1. A resistive memory comprising:
   a memory cell array including a plurality of resistive memory cells, the plurality of resistive memory cells being connected to a plurality of word-lines and to a plurality of bit-lines;
   a write/read circuitry connected to the memory cell array through a row decoder and through a column decoder, the write/read circuitry configured to perform a write operation to write data in a target page of the memory cell array, and configured to verify the write operation by comparing read data read from the target page with the write data; and a control circuitry configured to control at least one of the row decoder, the column decoder, or the write/read circuitry, the control circuitry configured to control a resistance along a current path including a selected memory cell, the selected memory cell connected to a selected bit-line and a selected word-line, the resistance based on at least one distance from at least one access point to the selected memory cell in the memory cell array, the at least one distance based on an address by adjusting a voltage level of the selected bit-line or a program current of the selected word-line, the adjusting with multi-steps, a number of the multi-steps based on the at least one distance.

2. The resistive memory of claim 1, wherein the at least one distance includes a first distance and a second distance, and the control circuitry is configured to control the resistance based on at least one of the first distance or the second distance, wherein the first distance corresponds to a distance from a first access point to the selected memory cell and the first access point corresponds to a row selection switch which selects the selected word-line of the plurality of word-lines that is connected to the selected memory cell, the first access point included in the at least one access point, and wherein the second distance corresponds to a distance from a second access point to the selected memory cell and the second access point corresponds to a column selection switch which selects the selected bit-line of the plurality of bit-lines that is connected to the selected memory cell, the second access point included in the at least one access point.

3. The resistive memory of claim 2, wherein at least one of (A) the control circuitry is configured to control the resistance based on the first distance, and at least one of
the control circuitry is configured to control a voltage level of a first selection signal applied to the row selection switch such that a resistance of the row selection switch increases in response to the first distance indicating that the selected memory cell is a near cell and the first distance is relatively near, or
the control circuitry is configured to control the voltage level of the first selection signal applied to the row selection switch such that the resistance of the row selection switch decreases in response to the first distance indicating that the selected memory cell is a far cell and the first distance is relatively far, or (B) the control circuitry is configured to control the resistance based on the second distance, and at least one of
the control circuitry is configured to control a voltage level of a second selection signal applied to the column selection switch such that a resistance of the column selection switch increases in response to the second distance indicating that the selected memory cell is a near cell and the second distance is relatively near, or
the control circuitry is configured to control the voltage level of the second selection signal applied to the column selection switch such that the resistance of the column selection switch decreases in response to the second distance indicating that the selected memory cell is a far cell and the second distance is relatively far.

4. The resistive memory of claim 1, wherein the control circuitry is configured to control a level of a first voltage based on a first distance and a level of a second voltage based on a second distance, wherein the first distance corresponds to a distance from a first access point to the selected memory cell and the first access point corresponds to a row selection switch which selects the selected word-line of the plurality of word-lines that is connected to the selected memory cell, a gate of the row selection switch receiving the first voltage, and wherein the second distance corresponds to a distance from a second access point to the selected memory cell and the second access point corresponds to a column selection switch which selects the selected bit-line of the plurality of bit-lines that is connected to the selected memory cell, a gate of the column selection switch receiving the second voltage.

5. The resistive memory of claim 1, wherein the control circuitry is configured to precharge the selected bit-line of the plurality of bit-lines, the precharge including controlling the write/read circuitry to increase a voltage level of the selected bit-line with the multi-steps.

6. The resistive memory of claim 5, wherein the control circuitry is configured to control the write/read circuitry to precharge the selected bit-line with N-steps, where N is a natural number greater than one.

7. The resistive memory of claim 5, wherein the control circuitry is configured to control the write/read circuitry to precharge the selected bit-line with N-steps, in response to the selected memory cell being relatively near to the access point, N being a natural number greater than one, or wherein the control circuitry is configured to control the write/read circuitry to precharge the selected bit-line with M-steps, in response to the selected memory cell being relatively far from the access point, M being a natural number greater than one and smaller than N.

8. The resistive memory of claim 1, wherein the control circuitry is configured to control the write/read circuitry to apply a program current having the multi-steps to the selected memory cell through the selected word-line of the plurality of word-lines.

9. The resistive memory of claim 8, wherein the control circuitry is configured to control the write/read circuitry to apply the program current having N-steps to the selected memory cell, N being a natural number greater than one.

10. The resistive memory of claim 8, wherein the control circuitry is configured to control the write/read circuitry to apply the program current having N-steps to the selected memory cell in response to the selected memory cell being relatively near to the access point, N being a natural number greater than one, or wherein the control circuitry is configured to control the write/read circuitry to apply the program current having M-step to the selected memory cell in response to the selected memory cell being relatively far from the access point, M being a natural number greater than one and smaller than N.

11. The resistive memory of claim 1, wherein the write/read circuitry includes:

a read circuitry connected to the selected bit-line that is connected to the selected memory cell, the selected bit-line being selected from the plurality of bit-lines, the read circuitry coupled to the selected bit-line through a column selection switch; and a write driver connected to the selected word-line that is connected to the selected memory cell, the selected word-line being selected from the plurality of word-lines, the write driver coupled to the selected word-line through a row selection switch.

12. The resistive memory of claim 11, wherein the read circuitry includes, a precharge circuitry connected to the column selection switch through a precharge node, and a clamping circuitry connected to the precharge node in parallel with the precharge circuitry, wherein the precharge circuitry includes a first p-channel metal oxide (PMOS) transistor connected between a power supply voltage and the precharge node, wherein the clamping circuitry includes, a second PMOS transistor and a first n-channel metal oxide (NMOS) transistor connected in series between the power supply voltage and the precharge node, and a third PMOS transistor and a second NMOS transistor connected in series between the power supply voltage and the precharge node, and wherein the second PMOS transistor and the first NMOS transistor are connected in parallel with the third PMOS transistor and the second NMOS transistor.

13. The resistive memory of claim 12, wherein the control circuitry is configured to precharge the selected bit-line with multi-steps by adjusting activation intervals of a precharge control signal applied to a gate of the first PMOS transistor and by clamping controls signals applied to gates of the second PMOS transistor and the third PMOS transistor, the control circuitry is configured to precharge the selected bit-line based on the distance of the selected memory cell.

14. The resistive memory of claim 11, wherein the write driver includes a first n-channel metal oxide (NMOS) transistor connected to the row selection switch through a data sensing node, the first NMOS transistor being connected between the data sensing node and a first negative voltage;

a second NMOS transistor connected between the data sensing node and a second negative voltage in parallel with the first NMOS transistor; and a third NMOS transistor connected between the data sensing node and the second negative voltage in parallel with the second NMOS transistor, and wherein the control circuitry is configured to apply a program current having multi-steps to the selected memory cell through the selected bit-line by adjusting activation intervals of program current control signals applied to gates of the first through third NMOS transistors based on the distance of the selected memory cell.

15. The resistive memory of claim 1, wherein each of the resistive memory cells includes a variable resistance element and a selection element connected in series between a corresponding word-line of the plurality of word-lines and a corresponding bit-line of the plurality of bit-lines, wherein the variable resistance element includes a phase change material whose resistance varies according to a temperature, and wherein the selection element includes an Ovonic Threshold Switch (OTS).

16. The resistive memory of claim 1, wherein the control circuitry includes:

a command decoder configured to decode a command from an external memory controller, and configured to output a decoded command;

an address buffer configured to receive the address from the memory controller and configured to output a row address and a column address based on the address;

a position information generator configured to compare the row address with a first reference address, configured to compare the column address with a second reference address, and configured to generate position information indicating the distance from the access point to the selected memory cell; and a control signal generator configured to generate control signals to control the row decoder, the column decoder, and the write/read circuitry based on the decoded command and the distance information.

17. The resistive memory of claim 1, wherein the control circuitry and the write/read circuitry are arranged on an integrated circuitry layer arranged on a substrate, and the memory cell array is arranged on the integrated circuitry layer, the memory cell array includes a first memory cell layer including first memory cells and a second memory cell layer including second memory cells, the first memory cells and the second memory cells sharing the bit-lines, and the word-lines include lower word-lines connected to the first memory cells and upper word-lines connected to the second memory cells.

18. A resistive memory comprising:

a memory cell array including a plurality of resistive memory cells connected to a plurality of word-lines and to a plurality of bit-lines;

a row decoder connected to the memory cell array through the plurality of word-lines, the row decoder including a plurality of row selection switches;

a column decoder connected to the memory cell array through the plurality of bit-lines, the column decoder including a plurality of column selection switches;

a write/read circuitry connected to the memory cell array through the row decoder and the column decoder, the write/read circuitry configured to perform a write operation to write data in a target page of the memory cell array, and configured to verify the write operation by comparing read data read from the target page with the write data; and a control circuitry configured to control at least one of the row decoder, the column decoder, or the write/read circuitry, the control circuitry configured to control a resistance along a current path, the current path including a selected memory cell connected to a selected word-line and a selected bit-line, the resistance according to a distance from an access point to the selected memory cell in the memory cell array, the distance based on an address, the controlling the resistance being by adjusting a voltage level of the selected bit-line or a program current of the selected word-line, the adjusting with multi-steps, a number of the multi-steps based on the distance.

19. The resistive memory of claim 18, wherein the write/read circuitry includes, a read circuitry connected to the selected bit-line connected to selected memory cell of the plurality of bit-line through a column selection switch of the plurality of column selection switches, and a write driver connected to the selected word-line connected to the selected memory cell of the plurality of word-line through a row selection switch of the plurality of row selection switches,
wherein the read circuitry includes,
a precharge circuitry connected to the column selection switch through a precharge node, and
a clamping circuitry connected to the precharge node in parallel with the precharge circuitry,
wherein the write driver includes,
a plurality of n-channel metal oxide (NMOS) transistors connected to the row selection switch through a data sensing node, the plurality of NMOS transistors being connected in parallel between the data sensing node and a negative voltage, and
wherein the control circuitry is configured to perform at least one of,
precharging the selected bit-line with multi-step by controlling the precharge circuitry and the clamping circuitry, or
applying a program current having multi-step to the selected memory cell through the selected word-line by controlling the plurality of NMOS transistors.

20. A method of operating a memory including a memory cell array that includes a plurality of resistive memory cells, the method comprising:
determining one of the plurality of resistive memory cells as a selected memory cell based on a row address and a column address; and
applying a program current to the selected memory cell during a program operation while first adjusting a level of a first voltage applied to a gate of a row selection switch and second adjusting a level of a second voltage applied to a gate of a column selection switch, the adjusting the level of the first voltage and of the second voltage being differently based on a distance from an access point to the selected memory cell in the memory cell array, the first adjusting and the second adjusting with multi-steps, a number of the multi-steps based on the distance,
wherein the row selection switch is connected to a word-line connected to the selected memory cell, and
wherein the column selection switch is connected to a bit-line connected to the selected memory cell.

* * * * *